(12) United States Patent
Waki et al.

(10) Patent No.: US 8,236,411 B2
(45) Date of Patent: Aug. 7, 2012

(54) CUTTING TOOL

(75) Inventors: Masahiro Waki, Kagoshima (JP);
Tatsuyuki Nakaoka, Kagoshima (JP);
Shuichi Tateno, Kagoshima (JP);
Takashi Watanabe, Kagoshima (JP);
Kenji Noda, Kagoshima (JP); Takahiko Makino, Kagoshima (JP); YaoCan Zhu,
Kagoshima (JP)

(73) Assignee: Kyocera Corporation, Kyoto (JP)

( * ) Notice: Subject to any disclaimer, the term of this patent is extended or adjusted under 35 U.S.C. 154(b) by 215 days.

(21) Appl. No.: 12/598,175

(22) PCT Filed: Mar. 25, 2009

(86) PCT No.: PCT/JP2009/055990
§ 371 (c)(1),
(2), (4) Date: Oct. 29, 2009

(87) PCT Pub. No.: WO2009/119682
PCT Pub. Date: Oct. 1, 2009

(65) Prior Publication Data
US 2010/0129168 A1 May 27, 2010

(30) Foreign Application Priority Data

Mar. 26, 2008 (JP) ................ 2008-080823
Dec. 24, 2008 (JP) ................ 2008-326977
Dec. 24, 2008 (JP) ................ 2008-326982
Jan. 28, 2009 (JP) ................ 2009-016261

(51) Int. Cl.
*B23B 27/14* (2006.01)

(52) U.S. Cl. ......... 428/216; 51/307; 51/309; 428/325; 428/336; 428/697; 428/698; 428/699; 428/704

(58) Field of Classification Search .......... 51/307, 51/309; 428/216, 325, 336, 697, 698, 699, 428/701, 702, 704
See application file for complete search history.

(56) References Cited

U.S. PATENT DOCUMENTS

| 5,853,873 | A | 12/1998 | Kukino et al. | |
| 7,521,131 | B2* | 4/2009 | Yamamoto | 428/699 |
| 7,811,683 | B2* | 10/2010 | Zhu et al. | 428/697 |
| 2006/0068225 | A1 | 3/2006 | Yamamoto | |

FOREIGN PATENT DOCUMENTS

| JP | 59-8679 A | 1/1984 |
| JP | 4-300241 A | 10/1992 |
| JP | 5-69205 A | 3/1993 |
| JP | 6-91407 A | 4/1994 |
| JP | 7-136810 A | 5/1995 |
| JP | 7-205362 A | 8/1995 |

(Continued)

*Primary Examiner* — Archene Turner
(74) *Attorney, Agent, or Firm* — Birch, Stewart, Kolasch & Birch, LLP

(57) ABSTRACT

An object of embodiments according to the invention is to provide a cutting tool having good wear resistance, good sliding property and good fracture resistance.
A cutting tool 1 comprising a substrate 2 and a coating layer 6 or a coating layer 9 which covers a surface of the substrate 2. The coating layer 6 or the coating layer 9 comprising a first layer 7 and a second layer 8. The first layer 7 comprises $Ti_{1-a-b-c-d}Al_aW_bSi_cM_d(C_{1-x}N_x)$ when M is at least one selected from Nb, Mo, Hf and Y, $0.45 \leq a \leq 0.55$, $0.01 \leq b \leq 0.1$, $0 \leq c \leq 0.05$, $0.01 \leq d \leq 0.1$, $0 \leq x \leq 1$). The second layer 8 comprises $Ti_{1-e-f-g}Al_eSi_fM'_g(C_{1-y}N_y)$ when M' is at least one selected from Nb, Mo, Ta, Hf and Y, $0.50 \leq e \leq 0.60$, $0 \leq f \leq 0.1$, $0.05 \leq g \leq 0.15$, $0 \leq y \leq 1$).

12 Claims, 4 Drawing Sheets

FOREIGN PATENT DOCUMENTS

| | | | |
|---|---|---|---|
| JP | 8-503664 A | 4/1996 | |
| JP | 8-119774 A | 5/1996 | |
| JP | 09-323204 | * | 12/1997 |
| JP | 10-251831 | * | 9/1998 |
| JP | 11-302831 A | 11/1999 | |
| JP | 2000-44348 A | 2/2000 | |
| JP | 2000-247746 A | 9/2000 | |
| JP | 2000-326108 A | 11/2000 | |
| JP | 2004-100004 | * | 4/2004 |
| JP | 2004-345006 A | 12/2004 | |
| JP | 2005-199420 A | 7/2005 | |
| JP | 2006-111915 A | 4/2006 | |
| JP | 2006-123159 A | 5/2006 | |
| JP | 2008-69031 A | 3/2008 | |

* cited by examiner

CUTTING TOOL

CROSS-REFERENCE TO RELATED APPLICATION

The present application is the United States national stage application of international application serial number PCT/JP2009/055990, filed on Mar. 25, 2009, which claims priority to Japanese patent application no. 2008-080823, filed on Mar. 26, 2008, Japanese patent application no. 2008-326977 filed on Dec. 24, 2008, and Japanese patent application no. 2008-326982, filed on Dec. 24, 2008, and Japanese patent application no. 2009-016261, filed on Jan. 28, 2009, each of which is incorporated herein by reference in its entirety.

TECHNICAL FIELD

The embodiments of the present invention relate generally to cutting tools, more particularly relate to cutting tools with coating layer.

BACKGROUND

For members requiring wear resistance, sliding properties, and fracture resistance, such as a cutting tool, an wear-resistant member, and a sliding member, a method for improving wear resistance, sliding properties, and fracture resistance is currently used, in which a coating layer is formed on a surface of a substrate composed of a sintered alloy such as a cemented carbide, cermet, or the like, a high-hardness sintered body such as diamond, cBN (cubic boron nitride), or the like, or ceramics such as alumina, silicon nitride, or the like.

As a method for depositing a coating layer, physical vapor deposition methods such as an arc ion plating method, a sputtering method, and the like are widely used. Among coating layer deposited by the physical vapor deposition methods, nitride layers containing Ti and Al as a main component are actively researched, and improvement for increasing the lives of cutting tools are continuously performed. For example, a coating layer having a (TiNbAl)N composition may be deposited, and a coating layer having a (AlTiNbSi)N(O) composition may be deposited. Both of the coating layers improve the oxidation resistance and wear resistance thereof. Further, a coating layer having a (TiWSi)N composition in order to enhance adhesion to a substrate composed of a cemented carbide or the like may be deposited.

In such a physical vapor deposition method, a method of providing a plurality of types of targets in a chamber and depositing a coating layer while rotating a sample so that the sample is in order brought close to the targets is attempted. This method can form a coating layer including a plurality of laminated layers having different compositions.

On the other hand, for example, a cutting tool may comprise an $Al_2O_3$—TiC based ceramic substrate called "black ceramic" and a coating layer formed on a surface of the substrate and including a TiAlN layer or the like. The cutting tool shows good cutting performance for cutting high-hardness materials. In addition, a coating layer containing at least one layer of TiC, TiN, and TiCN may be formed by a physical vapor deposition method on an $Al_2O_3$—TiC based ceramic substrate containing 0.1 to 5% by weight of iron group metal. The coating layer may enhance adhesion to the ceramic substrate and improve fracture resistance.

In addition, for example, a cutting tool may be composed of a silicon nitride sintered body containing 0.2% by weight or more of yttria ($Y_2O_3$) and 0.2% by weight of magnesia (MgO) in a total of 3.5% by weight or less, and 1.3 to 3.5% by weight of oxygen. Porosity in the sintered body of the cutting tool can be decreased to 0.2% by volume or less.

Further, for example, a cutting tool may comprise a cBN substrate and a coating layer of TiC, TiN, $Al_2O_3$, or the like deposited on a surface of the substrate. The cutting tool may improve wear resistance in cutting general steel and cast iron. In addition, a cutting tool may comprise a TiAlN layer formed on a surface of a cBN substrate. The cutting tool has a long life in cutting difficult to machine materials such as hardened steel and the like. Further, a cutting tool may comprise a cBN substrate and a coating layer formed on a surface of the substrate. The coating layer has a Ti/Al ratio of a TiAlSiN composition continuously changed. The cutting tool having the coating layer shows good chipping resistance in high-speed deep cutting.

However, the coating layer with the (TiNbAl)N composition, the coating layer with the (AlTiNbSi)N(O) composition, and the coating layer with the (TiWSi)N composition do not have sufficient fracture resistance, and the cutting tools are desired to have a longer life. Also, the cutting tools described above do not have sufficient cutting performance, and the cutting tools are desired to have a longer life.

In addition, the coating layer including a laminate of a nitride layer and an oxide layer does not have sufficient wear resistance.

Therefore, there is a need for improving wear resistance, fracture resistance, and chipping resistance in a cutting tool.

SUMMARY

Embodiments described herein provide a cutting tool having good wear resistance, adhesion resistance, and fracture resistance. A cutting tool according to an embodiment of the invention comprises a substrate and a coating layer which covers a surface of the substrate. The coating layer comprises a first layer comprising $Ti_{1-a-b-c-d}Al_aW_bSi_cM_d(C_{1-x}N_x)$ (wherein M is at least one selected from Nb, Mo, Ta, Hf, and Y, $0.45 \leq a \leq 0.55$, $0.01 \leq b \leq 0.1$, $0 \leq c \leq 0.05$, $0.01 \leq d \leq 0.1$, and $0 \leq x \leq 1$), and a second layer comprising $Ti_{1-e-f-g}Al_eSi_fM'_g(C_{1-y}N_y)$ (wherein M' is at least one selected from Nb, Mo, Ta, Hf, and Y, $0.50 \leq e \leq 0.60$, $0 \leq f \leq 0.1$, $0.05 \leq g \leq 0.15$, and $0 \leq y \leq 1$).

DETAILED DESCRIPTION OF EXEMPLARY EMBODIMENTS

Certain embodiments as disclosed herein provided for an acceleration sensor with a single end support structure a method for manufacturing the cutting tool.

After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention.

Figure 1:
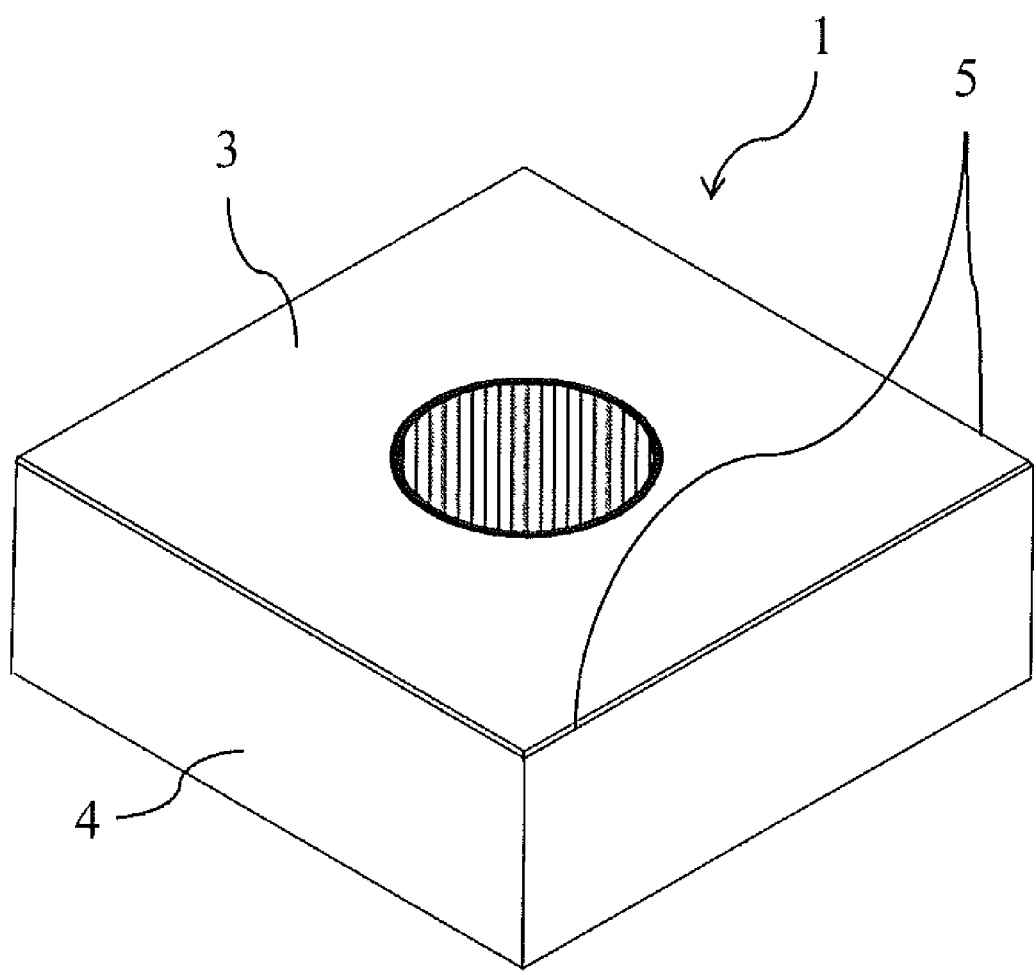
FIG. 1 is a schematic perspective view showing an example of a cutting tool of the present invention.
Figure 2:
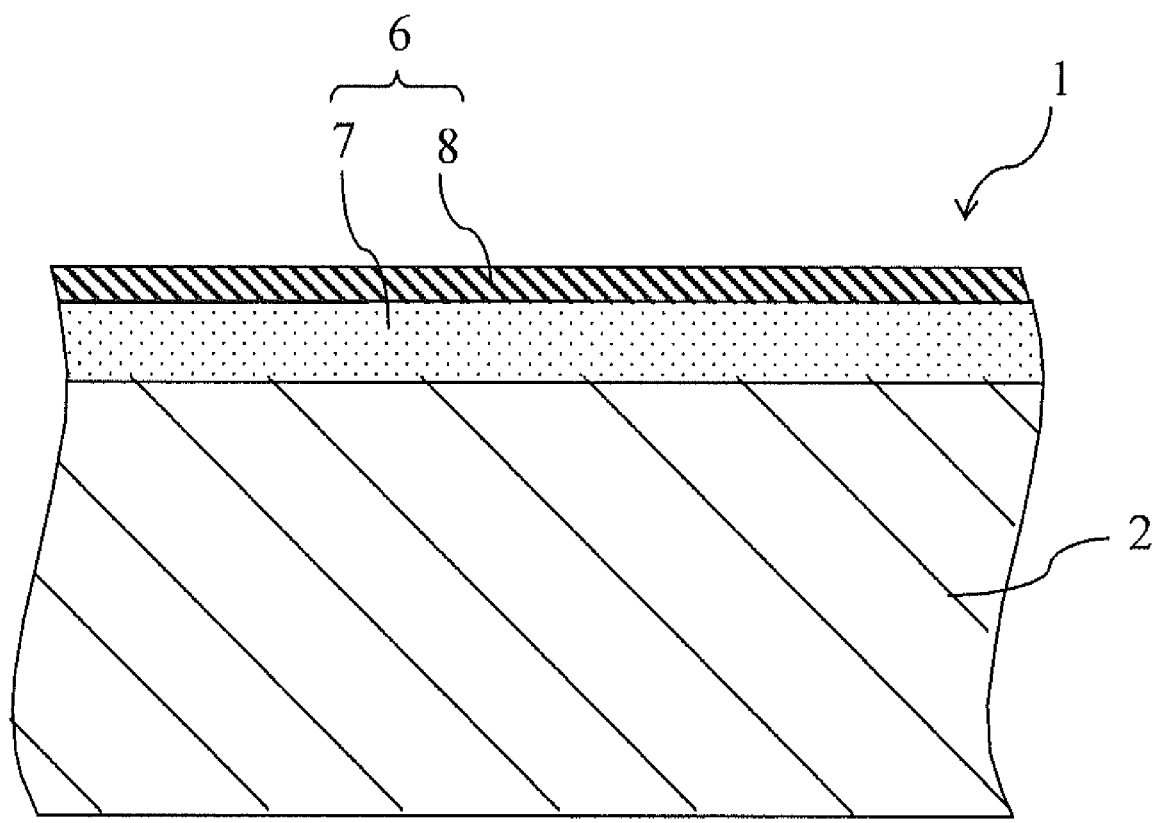
FIG. 2 is a schematic sectional view showing a first embodiment of the cutting tool shown in FIG. 1.

An example of a cutting tool of the present invention is described with reference to a schematic perspective view of FIG. 1 showing a cutting tool according to a preferred embodiment of the present invention, a schematic sectional view of FIG. 2 according to a first embodiment of the present invention, and a schematic sectional view of FIG. 3 according to a second embodiment of the present invention.

According to FIGS. 1 to 3, a cutting tool (simply abbreviated to a "tool" hereinafter) 1 according to embodiments described herein comprises a rake face 3 on a main surface, a flank face 4 on a side surface, a cutting edge 5 at a crossing ridge line between the rake face 3 and the flank face 4, and a coating layer 6 or 9 on a surface of a substrate 2.

The coating layer 6 or 9 comprises a first layer and the second layer. The first layer 7 comprises $Ti_{1-a-b-c-d}Al_aW_bSi_cM_d(C_{1-x}N_x)$ (wherein M is at least one selected from Nb, Mo, Ta, Hf, and Y, $0.45 \leq a \leq 0.55$, $0.01 \leq b \leq 0.1$, $0 \leq c \leq 0.05$, $0.01 \leq d \leq 0.1$, and $0 \leq x \leq 1$). The second layer 8 comprises $Ti_{1-e-f-g}Al_eSi_fM'_g(C_{1-y}N_y)$ (wherein M' is at least one selected from Nb, Mo, Ta, Hf, and Y, $0.50 \leq e \leq 0.60$, $0 \leq f \leq 0.1$, $0.05 \leq g \leq 0.15$, and $0 \leq y \leq 1$). In this configuration, the oxidation temperature of the first layer 7 can be increased to increase oxidation resistance and the inherent internal stress of the first layer 7 can be decreased to show high fracture resistance. In addition, the second layer 8 has higher hardness and oxidation resistance and high adhesion to the first layer 7. Therefore, the coating layer 6 or 9 has good wear resistance and fracture resistance under severe cutting conditions of machining of difficult-to-cut material, dry cutting, high speed machining, and the like.

Namely, in the first layer 7, when a (Al composition ratio) is smaller than 0.45, the oxidation resistance of the coating layer 6 or 9 is decreased, while when a (Al composition ratio) is larger than 0.55, the crystal structure of the coating layer 6 or 9 tends to be changed from a cubic structure to a hexagonal structure, decreasing hardness. A range of a may be $0.48 \leq a \leq 0.52$. In addition, when b (W composition ratio) is smaller than 0.01, the coating layer 6 or 9 has high internal stress to decrease fracture resistance and adhesion between the substrate 2 and the coating layer 6 or 9 to occur chipping or delamination of the first layer 7 easily during cutting. When b (W composition ratio) is larger than 0.1, the hardness of the coating layer 6 or 9 is decreased. A range of b may be $0.01 \leq b \leq 0.08$. Further, when c (Si composition ratio) is larger than 0.05, the hardness of the coating layer 6 or 9 is decreased. A range of c may be $0.01 \leq c \leq 0.04$. Further, when d (M composition ratio) is smaller than 0.01, the oxidation temperature is decreased, while when d (M composition ratio) is larger than 0.1, metal M is partially present as a low-hardness phase other than a cubic phase, thereby decreasing the hardness of the coating layer 6 or 9. A range of d may be $0.01 \leq d \leq 0.08$.

The metal M is at least one element selected from Nb, Mo, Ta, Hf, and Y, but the metal M may be Nb or Mo from the viewpoint of highest wear resistance and oxidation resistance.

Then, in the second layer 8, when e (Al composition ratio) is smaller than 0.5, the oxidation resistance of the coating layer 6 or 9 is decreased, while when e (Al composition ratio) is larger than 0.6, the crystal structure of the coating layer 6 or 9 tends to be changed from a cubic structure to a hexagonal structure, decreasing hardness. A range of e may be $0.54 \leq a \leq 0.56$. When f (W composition ratio) is larger than 0.1, the hardness of the coating layer 6 or 9 is decreased. A range of f may be $0.005 \leq f \leq 0.03$. Further, when g (M' composition ratio) is smaller than 0.05, the oxidation temperature is decreased, while when g (M' composition ratio) is larger than 0.15, metal M' is partially present as a low-hardness phase other than a cubic phase, thereby decreasing the hardness of the coating layer 6 or 9. A range of g may be $0.08 \leq d \leq 0.12$.

The metal M' is at least one element selected from Nb, Mo, Ta, Hf, and Y, but the metal M' may be Nb or Mo from the viewpoint of highest wear resistance and oxidation resistance.

In addition, C and N which are nonmetallic components of the coating layer 6 or 9 have good hardness and toughness required for the cutting tool. In order to decrease droplets (rough particles) occurring on the surface of the coating layer 6 or 9, a range of x may be $0.5 \leq x \leq 1$. The composition of the coating layer 6 or 9 can be measured by energy-dispersive X-ray spectrometry (EDX) or X-ray photoelectron spectrometry (XPS).

Since the internal stress of the first layer 7 is not so high, even if the thickness is increased, chipping is less likely to occur in the coating layer 6 or 9. Even when the total thickness of the coating layer 6 or 9 is 1.5 to 12 µm, delamination and chipping caused by the internal stress of the coating layer 6 or 9 can be reduced, and sufficient wear resistance can be maintained. A total thickness range of the coating layer 6 or 9 may be 5 to 7.5 µm. From the viewpoint that delamination of the first layer 7 and the second layer 8 from the substrate is reduced, and wear resistance is good, it may be that the thickness of the first layer 7 is 1 to 7 µm, and the thickness of the second layer 8 is 0.5 to 5 µm.

In addition, in this case, from the viewpoint of enhancing the hardness of the coating layer 6 or 9 and improving adhesion resistance on the surface of the coating layer 6 or 9, it may be that the average crystal width of the first layer 7 is 0.01 to 0.5 µm and the average crystal width of the second layer 8 is 0.6 to 3 µm. The average crystal width of the coating layer 6 or 9 is measured by drawing line A (not shown) at a position corresponding to an middle of the total thickness of the coating layer 6 or 9 in a sectional photograph of the coating layer 6 or 9. Specifically, line segment A having a length L (not shown) of 100 nm or more is specified, the number of grain boundaries along the line segment A is counted, and the average crystal width of columnar crystals (not shown) in the coating layer 6 or 9 is calculated by (average crystal width) =length L/number of grain boundaries.

Further, from the viewpoint of enhancing the toughness of the first layer 7 to enhance the fracture resistance of the coating layer 6 or 9, it may be that dispersed particles (not shown) having an average particle diameter of 0.05 to 1 µm are scattered in the first layer 7. As the dispersed particles, nitride grains having a higher tungsten (W) content than that in a matrix excluding the dispersed particles can be used. For example, when the whole composition of the coating layer 6 or 9 is $Ti_{1-a-b-c-d}Al_aW_bSi_cM_d(C_{1-x}N_x)$ (wherein M is at least one selected from Nb, Mo, Ta, Hf, and Y, $0.45 \leq a \leq 0.55$, $0.01 \leq b \leq 0.1$, $0 \leq c \leq 0.05$, $0.01 \leq d \leq 0.1$, and $0 \leq x \leq 1$), dispersed particles comprising $Ti_{1-a-b-c-d}Al_aW_bSi_cM_d(C_{1-y}N_y)$ (wherein M is at least one selected from Nb, Mo, Ta, Hf, and Y, $0 \leq a \leq 0.4$, $0.05 \leq b \leq 0.8$, $0 \leq c \leq 0.01$, $0 \leq d \leq 0.5$, and $0.2 \leq y \leq 1$) can be used.

Figure 3:
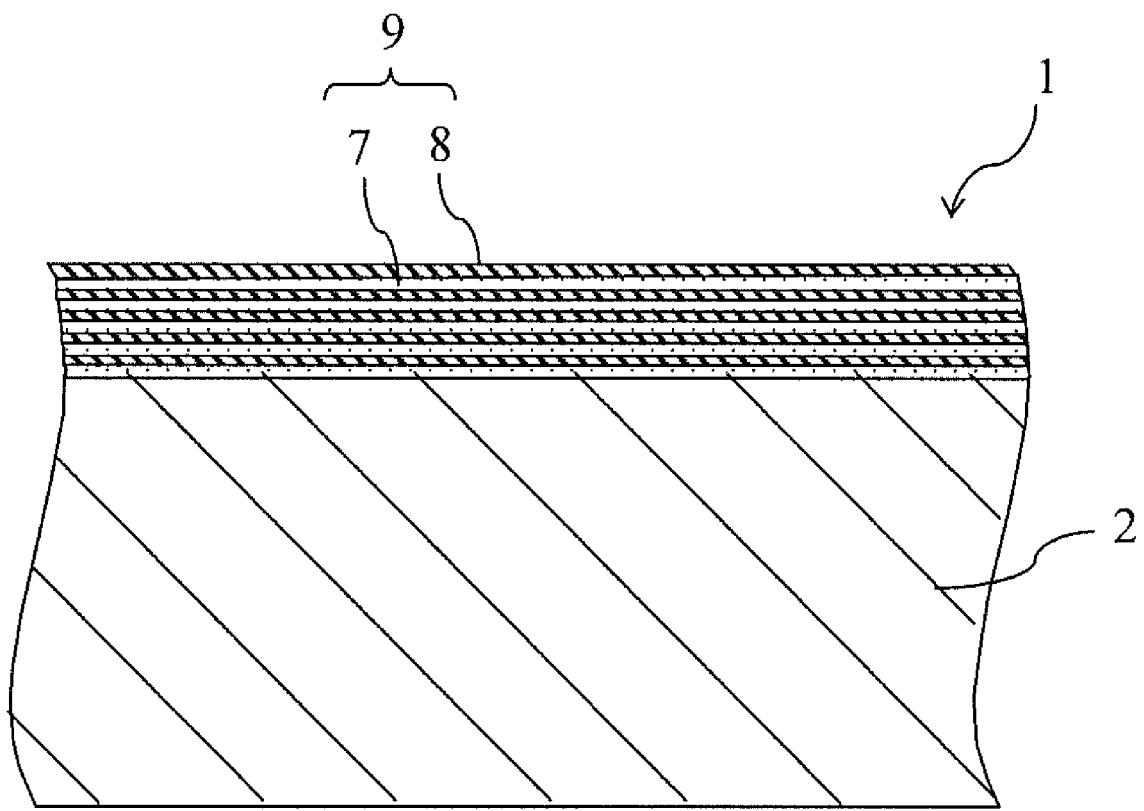
FIG. 3 is a schematic sectional view showing a second embodiment of the cutting tool shown in FIG. 1.

On the other hand, the configuration of the coating layer is not limited to the configuration of the coating layer 6, and, for example, the configuration of the coating layer 9 according to the second embodiment shown in FIG. 3 may be used.

That is, according to FIG. 3 showing the second embodiment of the present invention, the coating layer 9 comprises multiple layers comprising two or more first layers 7 and two or more second layers 8 which are alternately laminated. In this configuration, lattice strain energy is increased due to the presence of the interfaces between the first layers 7 and the second layers 8, thereby improving hardness and increasing wear resistance. In addition, when a crack occurs in the surface of the coating layer 9, propagation of the crack is reduced due to the presence of the interfaces between the first layers 7 and the second layers 8, thereby increasing fracture resistance of the coating layer 9.

In this case, from the viewpoint of improving the hardness and fracture resistance of the coating layer 9, it may be that the thickness of each of the first layers 7 is 0.02 to 0.7 μm, the thickness of each of the second layers 8 is 0.01 to 0.5 μm, the total thickness of the first layers 7 is 1 to 7 μm, and the total thickness of the second layers 8 is 0.5 to 5 μm.

In addition, as the substrate 2, a hard material such as a hard alloy such as a cemented carbide comprising a hard phase comprising tungsten carbide or titanium carbonitride as a main component and a binder phase comprising an iron group metal such as cobalt, nickel, or the like as a main component and cermet; ceramics comprising silicon nitride or aluminum oxide as a main component; a high pressure/high temperature sintered body sintered under very high pressure and high temperature, and the sintered body comprising a hard phase comprising polycrystalline diamond or cubic boron nitride and a binder phase comprising ceramics or an iron group metal; or the like is preferably used. Preferred examples of the substrate 2 are described below.

First Embodiment

A first example of the substrate 2 is a cemented carbide comprising 60 to 95% by mass of WC, 0 to 10% by mass of a carbide, a nitride, or a carbonitride of at least one of the group 4, 5, and 6a metals in the periodic table, and 5 to 30% by mass of an iron group metal. In particular, a K-grade cemented carbide comprising 88 to 95% by mass of WC, 0 to 1% by mass of a carbide, a nitride, or a carbonitride of at least one of the group 4, 5, and 6a metals in the periodic table, and 5 to 12% by mass of an iron group metal, or a M- or P-grade cemented carbide comprising 87 to 94% by mass of WC, 1 to 10% by mass of a carbide, a nitride, or a carbonitride of at least one of the group 4, 5, and 6a metals in the periodic table, and 5 to 12% by mass of an iron group metal can be used.

Second Embodiment

A second example of the substrate 2 is an $Al_2O_3$-based ceramics comprising $Al_2O_3$ particles and 0 to 1% by mass of MgO, a total of 10 to 70% by mass of at least one selected from the group consisting of a carbide, a nitride, and a carbonitride of Ti or Si, and a total of 0.1 to 2.0% by mass of at least one of Co and Ni. Since the ceramics comprises a carbide, a nitride, or a carbonitride of Ti or Si, the strength and toughness of the substrate can be enhanced, and the substrate has high adhesion to the coating layer 6 of the present invention. The content of at least one of a carbide, a nitride, and a carbonitride of Ti or Si may be 20 to 40% by mass from the viewpoint of reducing a difference between thermal expansion coefficient of the substrate and that of the coating layer 6. In particular, from the viewpoint that conductivity is imparted to the $Al_2O_3$-based ceramics to improve deposition by a PVD method, the content of TiC or TiCN may be 20 to 40% by mass. The content of at least one of Co and Ni may be 0.1 to 0.5% by mass from the viewpoint that conductivity is imparted to the $Al_2O_3$-based ceramics to permit the stable deposition of a coating layer with high adhesion by a physical vapor deposition method.

From the viewpoint of wear resistance and strength, in this embodiment, the average particle size of the $Al_2O_3$ particles contained in the $Al_2O_3$-based ceramics may be in the range of 0.05 to 3 μm, preferably 0.1 to 0.5 μm. From the viewpoint of improving wear resistance and toughness and adjusting conductivity, the average particle size of at least one of a carbide, a nitride, and a carbonitride of Ti or Si may be in the range of 0.2 to 3 μm, preferably 0.5 to 1 μm. The particle sizes of the $Al_2O_3$ particles and the compound particles of Ti or Si are measured according to the method for measuring the average particle diameter of a cemented carbide defined in CIS-019D-2005.

Third Embodiment

A third example of the substrate 2 is a silicon nitride-based ceramics comprising 94.5 to 99.5% by mass of silicon nitride, 0.1 to 4.5% by mass of a rare earth (RE) element oxide in terms of $RE_2O_3$, 0.3 to 2.5% by mass of magnesium oxide in terms of MgO, 0 to 0.6% by mass of aluminum oxide in terms of $Al_2O_3$, 0.1 to 4.5% by mass of residual oxygen in terms of silica ($SiO_2$), and 0 to 2% by mass of a silicide of a group 6 element in the periodic table. In this case, the hardness and high-temperature strength of the substrate 2 can be increased to increase the wear resistance and high-temperature fracture resistance of the substrate 2. A rare earth (RE) element compound, a magnesium compound, and an aluminum compound may be present as oxides from the viewpoint that silicon nitride particles can be strongly bonded by small amounts of the oxides to increase the content of silicon nitride crystals.

Further, the content of the rare earth (RE) element oxide may be 0.5 to 4.5% by mass, preferably 1 to 2.5% by mass, in terms of $RE_2O_3$ in order to densify the substrate 2. The content of magnesium oxide may be 0.35 to 2.0% by mass, preferably 0.4 to 1.0% by mass, in terms of MgO, thereby making a liquid phase generating temperature lower to densify the substrate 2 at a lower temperature. The content of aluminum oxide is preferably 0.3 to 0.5% by mass in terms of $Al_2O_3$, thereby making a liquid phase generating temperature lower to densify the sintered body in a lower temperature, and reducing a decrease in wear resistance due to a decrease in oxidation resistance. The residual oxygen is considered to be present as impurities of silicon nitride, i.e., as silica ($SiO_2$). In order to make the liquid phase generating temperature lower caused by a sintering aid, maintain densification of the sintered body, and make the sintered body have improved oxidation resistance and wear resistance, the content of the residual oxygen may be 0.1 to 4.5% by mass, preferably 1.5 to 2.2% by mass, in terms of $SiO_2$.

In addition, when lanthanum (La) is essentially comprised as a rare earth (RE) element, the sintered body can be densified at a low temperature as compared with the case in which lanthanum (La) is not comprised. Therefore, crystals in the sintered body can be made fine with suppressing abnormal grain growth. For example, in firing at 1730 to 1830° C. and normal pressure, it is able to make a relative density of the sintered body 99% or more and to make the average length of 6 silicon nitride crystal grains counted from the longer side in a field of view of 0.015 $mm^2$ 10 μm or less. As a result, the hardness and strength of the sintered body can be improved.

The rare earth (RE) compound, the magnesium compound, the aluminum compound, and silica ($SiO_2$) form grain boundary phases. The grain boundary phases may be partially precipitated as crystals. Since the hardness and high-temperature strength of the substrate 2 are enhanced by decreasing the content of the grain boundary phases to 7% by mass or less, particularly 5% by mass or less, the grain boundary phases are preferably present as amorphous phases in order to enhance the bonding of silicon nitride crystals while decreasing the absolute amount of grain boundary phases.

The silicon nitride crystals are present as main crystals. The silicon nitride crystals mainly may comprise β-silicon nitride crystals, and if required, the silicon nitride crystals partially comprise a small amount of aluminum to form β-sialon. In addition, β-silicon nitride crystals may be partially α-silicon nitride crystals. However, in order to enhance hardness and strength, the silicon nitride crystals may do not comprise α-silicon nitride crystals.

The silicide of a group 6 element in the periodic table can reduce a decrease in high-temperature strength and can blacken the color of the substrate 2. Examples of the silicide of a group 6 element in the periodic table include chromium silicide, molybdenum silicide, and tungsten silicide. For the reason that the silicide of a group 6 element in the periodic table can be present as fine particles in a sintered body using a fine oxide raw material, tungsten silicide may be used as the silicide of a group 6 element in the periodic table. The silicide of a group 6 element in the periodic table is dispersed in grain boundary phases of the substrate 2.

Fourth Embodiment

A fourth example of the substrate 2 is a cBN based ceramics comprising cBN particles comprising cBN coarse particles having a particle diameter of 4 to 6 μm and cBN fine particles having a particle diameter of 0.5 to 1.2 μm, these particles being bonded with binder phases. The binder phases comprise a carbide of at least one element selected from the groups 4, 5, and 6 in the periodic table and an iron group metal.

When the content of the cBN particles is less than 70% by volume, wear significantly proceeds. When the binder phases comprise only an iron group metal without comprising a carbide of at least one element selected from the groups 4, 5, and 6 in the periodic table, such as TiC or the like, wear of the binder phases significantly proceeds. Conversely, when the binder phases comprise only a carbide of at least one element selected from the groups 4, 5, and 6 in the periodic table without comprising an iron group metal, the retention of the cBN particles is decreased, thereby causing dropping of the cBN particles.

As a carbide of at least one element selected from the groups 4, 5, and 6 in the periodic table, TiC may be comprised for improving hardness and bonding force with cBN. In addition, as the iron group metal, Co may be comprised for satisfying interfaces between carbide phase and the cBN particles to decrease defects.

As a result of measurement of a particle size distribution of the cBN particles in a sectional structure of a sintered body, the cBN particles comprise a coarse-fine mixed grain structure having two peaks corresponding to cBN coarse particles having a particle diameter of 4 to 6 μm and cBN fine particles having a particle diameter of 0.5 to 1.2 μm. A specific measurement method for determining whether or not particles have a coarse-fine mixed grain structure is as follows. First, a microphotograph of a section of a sintered body is taken, and the area of each of 20 or more cBN particles is determined from the photograph by an image analysis method. Next, the particle diameter of the cBN particles is calculated according to the method for measuring an average particle diameter of a cemented carbide defined by CIS-019D-2005. Then, a particle size distribution of the cBN particles is measured, and it is determined whether or not the distribution has two peaks. When the two peaks include a larger size peak within a particle size range of 4 to 6 μm and a smaller size peak within a particle size range of 0.5 to 1.2 μm, it is defined that the cBN particles have two peaks corresponding to cBN coarse particles having a particle diameter of 4 to 6 μm and cBN fine particles having a particle diameter of 0.5 to 1.2 μm.

Further, in the sintered body, an intermediate phase may locate in the peripheral portion of the cBN particles thereof, the intermediate phase comprising an intermetallic compound, a carbide, a nitride, a carbonitride, a boride, a borocarbide, a boronitride, or an oxide of at least one element selected from the group consisting of the group 4, 5, and 6 metals in the periodic table, the iron group metals, and Al because the cBN particles can be strongly held.

Figure 4:
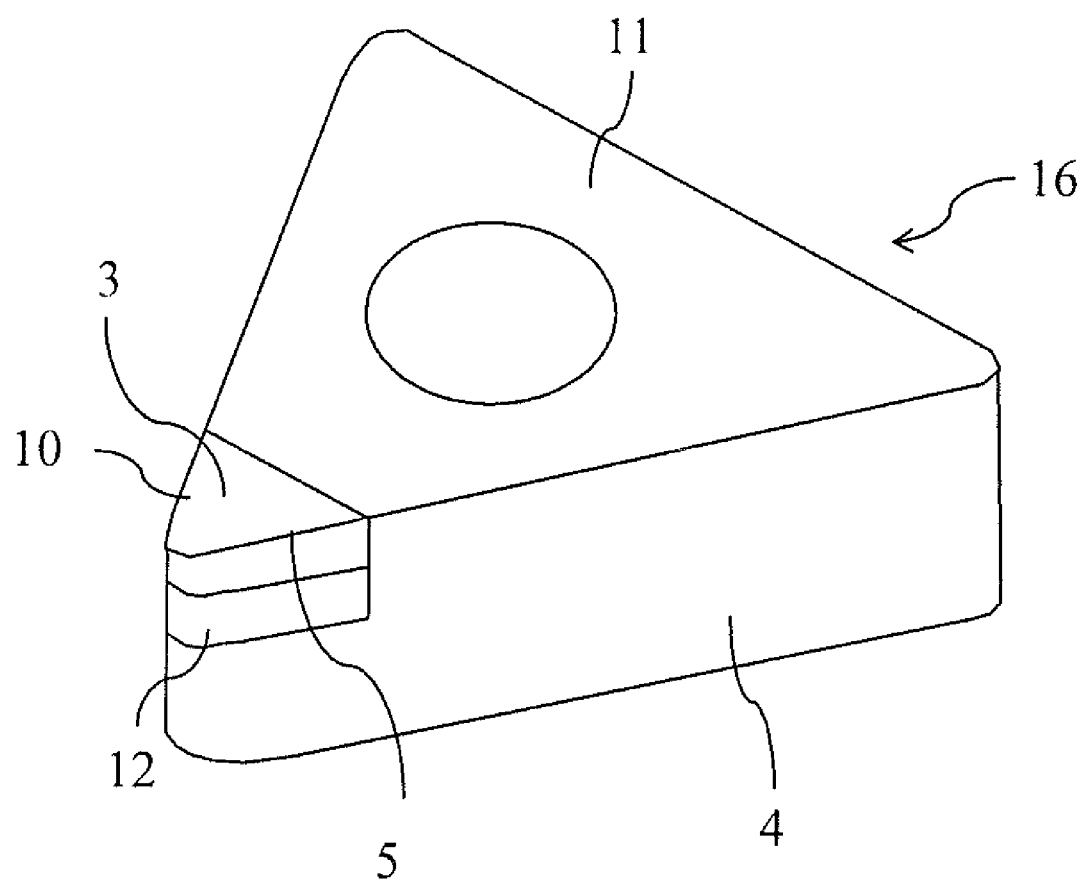
FIG. 4 is a schematic perspective view showing another example of a cutting tool of the present invention.

In the fourth embodiment, as shown in FIG. 4, a cutting tool may comprise a tip 16 having a shape in which a crossing ridge line between a rake face 13 and a flank face 14 serves as a cutting edge 15. The tip 16 has a structure in which a cutting tip 10 comprising the substrate 2 composed of a cBN sintered body is brazed to an end of a tip body 11 with a backing plate 12 lie between the cutting edge tip 10 and the tip body 11.

In any one of the first to fourth embodiments, in order to smoothen the surface of the coating layer 6 or 9 and enhance the adhesion to the coating layer 6 or 9, the interface between the substrate 2 and the coating layer 6 or 9 may have an interfacial roughness of 0.01 to 0.2 μm.

(Production Method)

Next, the method for producing the cutting tool according to an embodiment of the present invention is described.

First, the substrate 2 having a tool shape is formed by a known method. An example of the method for forming the substrate of each of the first to fourth embodiments is described below.

First Embodiment

A tungsten carbide (WC) powder, an iron group metal powder, and a powder of a carbide, a nitride, or a carbonitride of at least one of the group 4, 5, and 6a metals in the periodic table excluding WC are added and mixed at a predetermined ratio, and the mixture is formed into a throw away tip shape by a known molding method such as press molding or the like. Then, the molded product is subjected to debinding and then fired at 1350° C. to 1550° C. in vacuum or a non-oxidative atmosphere to form a cemented carbide.

Second Embodiment

For example, when an $Al_2O_3$ based ceramics is used as the substrate, an $Al_2O_3$ raw material powder having a predetermined average particle diameter within the range of 0.2 to 3 μm, a MgO powder having an average particle diameter of 0.5 to 2 μm, a CoO powder having an average particle diameter of 0.1 to 2 μm, and a NiO powder having an average particle diameter of 0.1 to 2 μm are weighed as raw material powders to obtain a specified composition and then ground and mixed.

Then, the mixed powder is molded into a predetermined shape. Molding can be performed by a known molding method such as press molding, injection molding, cast molding, extrusion molding, or the like. Then, the molded body is subjected to debinding and then fired at 1500° C. to 1750° C. in air or a non-oxidative atmosphere, preferably a non-oxidative reduced-pressure atmosphere of argon (Ar) or the like.

Third Embodiment

For example, when a $Si_3N_4$ based ceramics is used as the substrate, a silicon nitride ($Si_3N_4$) powder, a hydroxide (RE (OH)$_2$) or oxide (RE$_2$O$_3$) of a rare earth (RE) element, aluminum oxide (Al$_2$O$_3$), and magnesium hydroxide (Mg(OH)$_2$) are prepared as starting raw materials. If required, silicon dioxide (SiO$_2$) and a powder of a silicide of a group 6 element in the periodic table are prepared.

As the silicon nitride raw material, any one of a α-silicon nitride powder, a β-silicon nitride powder, and a mixture thereof can be used. The particle diameter of the powder may be 1 µm or less, particularly 0.5 µm or less. The silicon nitride raw material comprises inevitable oxygen as a silicon oxide. Therefore, a composition is adjusted in consideration that an oxide in the silicon nitride raw material is present as silica (SiO$_2$). When an oxygen content is insufficient, a silica (SiO$_2$) powder is added.

As the raw material of a rare earth (RE) element, an oxide powder may be used. For example, in the case of lanthanum (La), a compound, such as lanthanum hydroxide, which has low water absorption and which is converted to lanthanum oxide (La$_2$O$_3$) in a firing process, may be used because lanthanum oxide (La$_2$O$_3$) has high water absorption. As the magnesium (Mg) raw material, magnesium oxide (MgO) or magnesium carbonate (MgCO$_3$) may be used. Since magnesium oxide (MgO) has high water absorption and magnesium carbonate (MgCO$_3$) produces carbon dioxide gas, a compound, such as magnesium hydroxide (Mg(OH)$_2$), which has low water absorption, which does not produce carbon dioxide gas, and which is converted to magnesium oxide (MgO) in a firing process, may be used.

As a raw material for forming a silicide of a group 6 element in the periodic table, any one of an oxide, a carbide, a silicide, a nitride, and the like of a group 6 element in the periodic table may be used. However, an oxide may be used because a fine powder can be easily obtained at low cost.

Next, a binder and a solvent are appropriately added to the mixed powder containing the weighed raw materials, and the mixture is ground, dried by a spray drying method or the like, and then granulated. The granulated powder is molded into a desired shape by press molding.

Then, the molded body is fired, for example, at a temperature of 1650° C. to 1830° C. in a nitrogen atmosphere by normal pressure firing, gas pressure firing, hot pressing, or the like. The specific conditions for firing are as follows. First, the molded body is placed in a crucible made of a silicon nitride sintered body, and Si and Mg components are added to the crucible. A cover of the crucible is closed so that sealing is not so tight, and then the firing pot is set in a firing furnace. After the inside of the firing furnace is replaced with nitrogen at 1 atmosphere, the temperature is increased at 5 to 15° C./min, and the crucible is maintained at 1730° C. to 1830° C. for 5 to 10 hours and then cooled. In addition, during firing, the atmosphere in the furnace is adjusted to kept at nitrogen 1 atmosphere by degassing or adding nitrogen gas.

The Si and Mg components to be placed in the firing pot together with the molded body are placed in the state of a Si powder, SiO$_2$ powder, or Si$_3$N$_4$ powder and a MgO powder or Mg(OH)$_2$ powder. Under a condition in which these powders are placed around the molded body or bedded below the molded body, or the molded body is packed in the powders, firing is performed so that SiO gas and MgO gas are produced in the firing atmosphere to promote sintering.

In addition, from the viewpoint of producing the dense cutting tool 1 in which abnormal grain growth of the silicon nitride crystals is reduced and chipping resistance is improved, it is preferred to perform firing at 1730° C. to 1830° C. in a nitrogen atmosphere and then perform hot isostatic firing at 9.8 MPa to 294 MPa and 1500° C. to 1700° C.

Fourth Embodiment

For example, when a cBN based ceramics is used as the substrate, a coarse particle cBN raw material powder having an average particle diameter of 4 to 6 µm, a fine particle cBN raw material powder having an average particle diameter of 0.1 to 1.5 µm, a carbide powder of at least one element selected from the group 4, 5, and 6 metals in the periodic table having an average particle diameter of 0.2 to 3 µm, and, if required, at least one raw material powder of Al having an average particle diameter of 0.5 to 5 µm and the iron group metals having an average particle diameter of 0.5 to 3 µm are weighed as raw material powders to obtain a specified composition. Then, these powders are ground and mixed with a ball mill for 16 to 72 hours.

Then, if required, the mixture is molded into a predetermined shape. Molding can be performed by a known molding method such as press molding, injection molding, cast molding, extrusion molding, or the like.

Then, the molded body is charged in a very high pressure sintering apparatus together with a cemented carbide-supporting plate and maintained at a predetermined temperature in the range of 1200° C. to 1600° C. and a pressure of 4 to 6 GPa for 10 to 30 minutes to prepare a cubic boron nitride sintered body of this embodiment. In order that the cubic born nitride sintered body has a structure in which a carbide of a group 4, 5, or 6 metal in the periodic table and a nitride of a group 4, 5, or 6 metal in the periodic table are separately present, it may be that the heating rate and cooling rate are 30 to 50° C./min, the predetermined temperature is in the range of 1400° C. to 1600° C., the pressure is 5 GPa, and the heating retention time is 10 to 15 minutes.

A surface of the resulting substrate 2 is cut according to demand, and then the coating layer 6 or 9 is deposited on the surface of the substrate 2. As the method for depositing the coating layer 6 or 9, a physical vapor deposition (PVD) method such as an ion plating method, a sputtering method, or the like can be used.

A preferred example of the coating method of the present invention is a method of depositing the coating layer 6 or 9 under a condition in which two types of targets including a first target and a second target are set in an arc ion plating apparatus. For example, a method may comprise applying a bias voltage to the first target to produce plasma and form the first layer 7, then dropping the bias voltage applied to the first target, and applying a bias voltage to the second target to produce plasma and form the second layer 8.

Specifically, arc discharge or glow discharge is applied to an arc ion plating cathode at a bias voltage of 30 to 200 V and a deposition temperature of 400 to 600° C. to ionize a metal source by evaporation. Nitrogen (N$_2$) gas as a nitrogen source and methane (CH$_4$)/acethylene (C$_2$H$_2$) gas as a carbon source are flowed at a gas pressure of 2 to 5 Pa and reacts with the ionized metal. As a result, the first layer 7 and the second layer 8 can be deposited in order to form the coating layer 6.

In addition, a bias voltage is applied to both the first target and the second target, and in this state, deposition can be performed while a sample is rotated to form the coating layer 9 in which two or more first layers 7 and two or more second layers 8 are alternately laminated. When the coating layer 6 is deposited, a sample may be rotated in order to make the deposited coating layer uniform.

Examples of the cathode include a metal cathode comprising independently metallic titanium (Ti), metallic aluminum (Al), metallic W, metallic Si, or metallic M or M' (M and M' are as described above), an alloy cathode containing a composite of these metals, and a mixture cathode comprising a carbide, a nitride, a boride compound powder, or a sintered body of these metals.

Example 1

A tungsten carbide (WC) powder as a main component having an average particle diameter of 0.8 μm, 10% by mass of a metallic cobalt (Co) powder having an average particle diameter of 1.2 μm, 0.1% by mass of a vanadium carbide (VC) powder having an average particle diameter of 1.0 μm, and 0.3% by mass of a chromium carbide ($Cr_3C_2$) powder having an average particle diameter of 1.0 μm were added and mixed. The resultant mixture was molded by press molding into a throw away tip shape of CNMG 120408MS, subjected to debinding, and fired in a vacuum of 0.01 Pa at 1450° C. for 1 hour to prepare a cemented carbide. In addition, a rake face of each sample was polished by blasting, brushing, or the like. Further, the formed cemented carbide was subjected to honing edge (honing)) by brushing.

First and second targets for depositing the first layer and second layer shown in Table 2 were disposed to face the substrate prepared as described above in a deposition apparatus. Then, a bias voltage was applied using the first target under the first layer deposition conditions and then using the second target under the second layer deposition conditions to form a coating layer on each sample under the deposition conditions shown in Table 1.

A section containing the surface of the coating layer of each of the samples (I-1 to 14) was observed with a transmission electron microscope (TEM), and the average crystal width of crystals constituting the coating layer was determined. In observation with TEM, the compositions at any desired three positions of the coating layer were measured by energy dispersive spectrometry (EDS), and an average value was calculated as the composition of each coating layer. Further, the presence of dispersed particles in the coating layer and the composition thereof were confirmed.

Next, a cutting test was conducted using the throw-away tip of turning tool having CNMG 120408MS shape under the following cutting conditions. The results are shown in Table 3.

Cutting method: external turning

Workpiece: SUS304

Cutting speed: 150 m/min

Feed: 0.2 mm/rev

Depth of cut: 2.0 mm

Cutting condition: wet machining

Evaluation method: After cutting for 30 minutes, side flank wear and nose wear, and chipping were measured by a microscope.

TABLE 1

| Sample No | First layer deposition condition | | | Second layer deposition condition | | |
|---|---|---|---|---|---|---|
| | Deposition temperature (° C.) | Bias voltage (V) | Nitrogen gas pressure (Pa) | Deposition temperature (° C.) | Bias voltage (V) | Nitrogen gas pressure (Pa) |
| I-1 | 500 | 75 | 3.5 | 500 | 150 | 3.5 |
| I-2 | 500 | 100 | 5.0 | 470 | 175 | 5.0 |
| I-3 | 550 | 100 | 3.0 | 580 | 100 | 4 |
| I-4 | 530 | 120 | 2.5 | 550 | 100 | 3.2 |
| I-5 | 500 | 70 | 3.5 | 500 | 75 | 3.5 |
| I-6 | 520 | 70 | 3.5 | 550 | 125 | 4 |
| I-7 | 500 | 125 | 3.0 | 550 | 150 | 3.2 |
| I-8 | 500 | 200 | 5.0 | 550 | 170 | 4.5 |
| I-9 | 550 | 100 | 3.5 | 580 | 135 | 4 |
| I-10 | 500 | 100 | 3.5 | | — | |
| I-11 | 500 | 50 | 2.5 | 580 | 100 | 3.5 |
| I-12 | 500 | 125 | 4.5 | 550 | 150 | 3.5 |
| I-13 | 550 | 75 | 3.5 | 600 | 125 | 4 |
| I-14 | 500 | 65 | 4.0 | 550 | 120 | 4.5 |

TABLE 2

| Sample No | First layer | | | | Second layer | | | Total thickness (μm) |
|---|---|---|---|---|---|---|---|---|
| | Composition | Average crystal width (μm) | Thickness $t_1$ (μm) | Average particle diameter of dispersed particle (μm) | Composition | Average crystal width (μm) | Thickness $t_2$ (μm) | |
| I-1 | $Ti_{0.40}Al_{0.48}W_{0.04}Si_{0.05}Nb_{0.03}N$ | 0.23 | 4.0 | 0.15 | $Ti_{0.34}Al_{0.55}Si_{0.01}Nb_{0.10}N$ | 1.5 | 2.0 | 6.0 |
| I-2 | $Ti_{0.45}Al_{0.49}W_{0.03}Si_{0.01}Nb_{0.02}N$ | 0.18 | 5.0 | 0.10 | $Ti_{0.33}Al_{0.54}Si_{0.02}Nb_{0.11}N$ | 1.3 | 2.0 | 7.0 |
| I-3 | $Ti_{0.41}Al_{0.53}W_{0.01}Mo_{0.05}N$ | 0.21 | 7.0 | — | $Ti_{0.31}Al_{0.54}Si_{0.02}Mo_{0.13}N$ | 2.6 | 3.0 | 10.0 |
| I-4 | $Ti_{0.40}Al_{0.49}W_{0.05}Si_{0.03}Y_{0.03}N$ | 0.20 | 3.0 | 0.22 | $Ti_{0.30}Al_{0.58}Si_{0.02}Y_{0.10}N$ | 1.8 | 2.0 | 5.0 |
| I-5 | $Ti_{0.40}Al_{0.48}W_{0.05}Si_{0.02}Ta_{0.05}N$ | 0.30 | 3.0 | 0.20 | $Ti_{0.33}Al_{0.51}Si_{0.03}Ta_{0.13}N$ | 2.3 | 1.0 | 4.0 |
| I-6 | $Ti_{0.44}Al_{0.48}W_{0.04}Si_{0.03}Hf_{0.01}N$ | 0.32 | 4.0 | 0.16 | $Ti_{0.28}Al_{0.58}Si_{0.08}Hf_{0.06}N$ | 2.3 | 1.5 | 5.5 |
| I-7 | $Ti_{0.36}Al_{0.48}W_{0.04}Si_{0.02}Nb_{0.1}N$ | 0.15 | 5.0 | 0.13 | $Ti_{0.30}Al_{0.54}Si_{0.04}Nb_{0.05}Mo_{0.07}N$ | 2.0 | 2.5 | 7.5 |
| I-8 | $Ti_{0.45}Al_{0.45}W_{0.03}Si_{0.05}Nb_{0.02}N$ | 0.10 | 5.0 | 0.05 | $Ti_{0.29}Al_{0.52}Si_{0.06}Nb_{0.13}N$ | 2.5 | 3.0 | 8.0 |
| I-9 | $Ti_{0.35}Al_{0.51}W_{0.1}Si_{0.03}Mo_{0.01}C_{0.2}N_{0.8}$ | 0.22 | 3.0 | 0.63 | $Ti_{0.32}Al_{0.59}Si_{0.01}Nb_{0.08}C_{0.3}N_{0.7}$ | 1.9 | 0.5 | 3.5 |
| I-10 | $Ti_{0.41}Al_{0.50}W_{0.04}Mo_{0.03}N$ | 0.22 | 4.0 | 0.26 | | | — | 4.0 |
| I-11 | $Ti_{0.40}Al_{0.45}Cr_{0.05}W_{0.1}N$ | 0.40 | 4.0 | 0.03 | $Ti_{0.32}Al_{0.55}Si_{0.10}Nb_{0.03}N$ | 1.8 | 2.0 | 6.0 |
| I-12 | $Ti_{0.30}Al_{0.45}Si_{0.2}Nb_{0.05}N$ | 0.16 | 3.0 | No | $Ti_{0.23}Al_{0.58}Si_{0.03}Nb_{0.16}N$ | 0.9 | 2.0 | 5.0 |
| I-13 | $Ti_{0.41}Al_{0.55}W_{0.02}Si_{0.01}Mo_{0.01}N$ | 0.28 | 3.0 | 0.05 | $Ti_{0.41}Al_{0.50}W_{0.04}Si_{0.02}Mo_{0.03}N$ | 2.5 | 1.0 | 4.0 |
| I-14 | $Ti_{0.30}Al_{0.45}Si_{0.2}Nb_{0.05}N$ | 0.35 | 4.0 | No | $(Ti_{0.52}Al_{0.48})(N_{0.8}O_{0.2})$ | 2.3 | 2.0 | 6.0 |

TABLE 3

| Sample No | Chipping | Flank wear (mm) | Nose wear (mm) |
|---|---|---|---|
| I-1 | No | 0.13 | 0.15 |
| I-2 | No | 0.12 | 0.14 |
| I-3 | Microchipping | 0.24 | 0.25 |
| I-4 | No | 0.17 | 0.19 |
| I-5 | No | 0.19 | 0.21 |
| I-6 | No | 0.17 | 0.19 |
| I-7 | No | 0.16 | 0.17 |
| I-8 | No | 0.20 | 0.23 |
| I-9 | Microchipping | 0.21 | 0.23 |

TABLE 3-continued

| Sample No | Chipping | Flank wear (mm) | Nose wear (mm) |
|---|---|---|---|
| I-10 | Microchipping | 0.45 | 0.48 |
| I-11 | Chipping (delamination) | 0.31 | 0.35 |
| I-12 | Early fracture | — | — |
| I-13 | Microchipping | 0.36 | 0.39 |
| I-14 | Microchipping | 0.42 | 0.45 |

According to the results shown in Tables 1 to 3, in Sample No. I-10 including only the first layer without the second layer, microchipping occurs, and wear resistance is low. In addition, in Samples Nos. I-11 and I-12 including the first layer and Sample No. I-14 including the first layer and the second layer, wear proceeds due to delamination of the coating layer or fracture occurs in an early stage, and thus the tools have a short lifetime. Further, in Sample No. I-13 including the first layer and the second layer comprising the same metal component, wear resistance is poor, and fracture resistance is decreased.

In contrast, in Sample Nos. I-1 to 9, the coating layers have good fracture resistance and oxidation resistance, and good cutting performance is exhibited.

Example 2

In contrast to the coating layer in Example 1, First and second targets for depositing the first layer and second layer shown in Table 4 were disposed to face each other in a deposition apparatus. A cutting tool was formed by the same method as in Example 1 except for a method of forming a coating layer. In the method of forming a coating layer, a sample support set in the apparatus was rotated while plasma was generated from both targets under the deposition conditions shown in Table 4, forming a coating layer in which the first and second layers were alternately laminated with the thickness period shown in Table 4. The cutting performance was evaluated by the same method as in Example 1 (I-15 to 28). The results are shown in Table 5.

TABLE 4

| | Deposition condition | | | First layer | | Second layer | | |
|---|---|---|---|---|---|---|---|---|
| Sample No | Deposition temperature (°C.) | Bias voltage (V) | Nitrogen gas pressure (Pa) | Composition | Thickness $T_1$ (nm) | Composition | Thickness $T_2$ (nm) | Total thickness (μm) |
| I-15 | 550 | 150 | 4 | $Ti_{0.40}Al_{0.48}W_{0.04}Si_{0.05}Nb_{0.03}N$ | 45 | $Ti_{0.34}Al_{0.55}Si_{0.01}Nb_{0.10}N$ | 45 | 6.0 |
| I-16 | 500 | 100 | 4.5 | $Ti_{0.45}Al_{0.49}W_{0.03}Si_{0.01}Nb_{0.02}N$ | 50 | $Ti_{0.33}Al_{0.54}Si_{0.02}Nb_{0.11}N$ | 50 | 7.0 |
| I-17 | 550 | 125 | 3.0 | $Ti_{0.41}Al_{0.53}Si_{0.01}Mo_{0.05}N$ | 45 | $Ti_{0.31}Al_{0.54}Si_{0.02}Mo_{0.13}N$ | 40 | 10.0 |
| I-18 | 530 | 200 | 3 | $Ti_{0.40}Al_{0.49}W_{0.05}Si_{0.03}Y_{0.03}N$ | 40 | $Ti_{0.30}Al_{0.58}Si_{0.02}Y_{0.10}N$ | 45 | 5.0 |
| I-19 | 500 | 95 | 5 | $Ti_{0.40}Al_{0.48}W_{0.05}Si_{0.02}Ta_{0.05}N$ | 45 | $Ti_{0.36}Al_{0.51}Si_{0.03}Ta_{0.13}N$ | 50 | 4.0 |
| I-20 | 520 | 150 | 2.5 | $Ti_{0.44}Al_{0.48}W_{0.04}Si_{0.03}Hf_{0.01}N$ | 65 | $Ti_{0.28}Al_{0.58}Si_{0.08}Hf_{0.06}N$ | 65 | 5.5 |
| I-21 | 500 | 125 | 3.0 | $Ti_{0.36}Al_{0.48}W_{0.04}Si_{0.02}Nb_{0.1}N$ | 55 | $Ti_{0.30}Al_{0.54}Si_{0.04}Nb_{0.05}Mo_{0.07}N$ | 55 | 7.5 |
| I-22 | 500 | 125 | 4.5 | $Ti_{0.45}Al_{0.45}W_{0.03}Si_{0.05}Nb_{0.02}N$ | 55 | $Ti_{0.29}Al_{0.52}Si_{0.06}Nb_{0.13}N$ | 50 | 8.0 |
| I-23 | 550 | 100 | 3.5 | $Ti_{0.35}Al_{0.51}W_{0.1}Si_{0.03}Mo_{0.01}C_{0.2}N_{0.8}$ | 40 | $Ti_{0.32}Al_{0.59}Si_{0.01}Nb_{0.08}C_{0.3}N_{0.7}$ | 50 | 3.5 |
| I-24 | 500 | 100 | 4 | $Ti_{0.41}Al_{0.50}W_{0.04}Si_{0.02}Mo_{0.03}N$ | 45 | — | | 4.0 |
| I-25 | 500 | 75 | 2.5 | $Ti_{0.40}Al_{0.45}Cr_{0.05}W_{0.1}N$ | 60 | $Ti_{0.32}Al_{0.55}Si_{0.10}Nb_{0.03}N$ | 55 | 6.0 |
| I-26 | 500 | 125 | 4 | $Ti_{0.30}Al_{0.45}Si_{0.2}Nb_{0.05}N$ | 55 | $Ti_{0.23}Al_{0.58}Si_{0.03}Nb_{0.16}N$ | 60 | 5.0 |
| I-27 | 550 | 100 | 4.5 | $Ti_{0.41}Al_{0.55}W_{0.02}Si_{0.01}Mo_{0.01}N$ | 60 | $Ti_{0.41}Al_{0.50}W_{0.04}Si_{0.02}Mo_{0.03}N$ | 50 | 4.0 |
| I-28 | 500 | 75 | 4.0 | $Ti_{0.30}Al_{0.45}Si_{0.2}Nb_{0.05}N$ | 45 | $(Ti_{0.52}Al_{0.48})(N_{0.8}O_{0.2})$ | 50 | 6.0 |

TABLE 5

| Sample No | Chipping | Flank wear (mm) | Nose wear (mm) |
|---|---|---|---|
| I-15 | No | 0.12 | 0.14 |
| I-16 | No | 0.14 | 0.14 |
| I-17 | No | 0.23 | 0.25 |
| I-18 | No | 0.14 | 0.17 |
| I-19 | No | 0.21 | 0.23 |
| I-20 | No | 0.17 | 0.2 |
| I-21 | No | 0.16 | 0.17 |
| I-22 | No | 0.24 | 0.28 |
| I-23 | Microchipping | 0.24 | 0.25 |
| I-24 | Microchipping | 0.45 | 0.48 |
| I-25 | Chipping (delamination) | 0.30 | 0.33 |
| I-26 | Early fracture | — | — |
| I-27 | Microchipping | 0.34 | 0.39 |
| I-28 | Microchipping | 0.39 | 0.42 |

According to the results shown in Tables 4 and 5, in Sample No. I-24 including only the first layer, microchipping occurs, and wear resistance is low. In addition, in Samples No. I-25 and I-26 including the first layer and Sample No. I-28 including the first layer and the second layer, wear proceeds due to delamination of the coating layer or fracture occurs in an early stage, and thus the tools have a short lifetime. Further, in Sample No. I-27 including the first layer and the second layer comprising the same metal component, wear resistance is poor, and fracture resistance is decreased.

In contrast, in Sample Nos. I-15 to 23, the coating layers have good fracture resistance and oxidation resistance, and good cutting performance is exhibited.

Example 3

A throw-away tip was formed by the same method as in Example 1 except that the composition of the cemented carbide substrate of Example 1 was changed to each of the compositions shown in Table 6. A cutting test was performed under the same conditions as in Example 1. The results are shown in Tables 6 to 8. Further, the vicinity of the interface between the substrate and the coating layer was observed with a scanning electron microscope to trace unevenness of the interface. The interfacial roughness was estimated using a traced line according to the method for calculating arithmetic average height (Ra) defined in JISB0601-2001. The measurement results are shown as interfacial roughness in Table 6.

TABLE 6

| Sample No | Prepared composition (% by mass) | | | Interfacial roughness (μm) | First layer deposition condition | | | Second layer deposition condition | | |
|---|---|---|---|---|---|---|---|---|---|---|
| | WC | Other additive | Co | | Deposition temperature (°C.) | Bias voltage (V) | Nitrogen gas pressure (Pa) | Deposition temperature (°C.) | Bias voltage (V) | Nitrogen gas pressure (Pa) |
| II-1 | Balance | TiC 3.2<br>TaC 7.4 | 9.4 | 0.22 | 400 | 100 | 3.5 | 550 | 125 | 2 |
| II-2 | Balance | TiC 2.8<br>ZrC 0.3 | 7.5 | 0.21 | 520 | 100 | 2.8 | 550 | 175 | 0.7 |
| II-3 | Balance | TaC 0.3<br>$Cr_3C_2$ 2.7<br>VC 0.4 | 11.2 | 0.24 | 480 | 200 | 4.2 | 550 | 175 | 2 |
| II-4 | Balance | TaC 1.4<br>NbC 0.1 | 8.9 | 0.29 | 580 | 125 | 3.5 | 550 | 150 | 1.5 |

TABLE 7

| Sample No | First layer | | | | Second layer | | | Total thickness (μm) |
|---|---|---|---|---|---|---|---|---|
| | Composition | Average crystal width (μm) | Thickness $t_1$ (μm) | Average particle diameter of dispersed particle (μm) | Composition | Average crystal width (μm) | Thickness $t_2$ (μm) | |
| II-1 | $Ti_{0.44}Al_{0.48}W_{0.04}Si_{0.03}Hf_{0.01}N$ | 0.21 | 4.0 | No | $Ti_{0.34}Al_{0.54}Si_{0.02}Y_{0.10}N$ | 2.2 | 2.6 | 6.6 |
| II-2 | $Ti_{0.41}Al_{0.48}W_{0.05}Si_{0.03}Y_{0.03}N$ | 0.30 | 3.6 | 0.20 | $Ti_{0.30}Al_{0.59}Si_{0.03}Nb_{0.08}N$ | 2.5 | 1.3 | 4.9 |
| II-3 | $Ti_{0.42}Al_{0.46}W_{0.05}Ta_{0.07}N$ | 0.22 | 3.5 | 0.09 | $Ti_{0.35}Al_{0.50}Si_{0.02}Mo_{0.13}N$ | 1.2 | 0.8 | 4.3 |
| II-4 | $Ti_{0.40}Al_{0.50}W_{0.03}Si_{0.03}Nb_{0.04}N$ | 0.42 | 3.6 | 0.48 | $Ti_{0.34}Al_{0.55}Si_{0.01}Nb_{0.10}N$ | 1.1 | 2.3 | 5.9 |

TABLE 8

| Sample No | Ratio of droplet (area %) | Cutting characteristic | | |
|---|---|---|---|---|
| | | Chipping | Flank wear (mm) | Nose wear (mm) |
| II-1 | 9.2 | No | 0.24 | 0.2 |
| II-2 | 16.5 | No | 0.34 | 0.26 |
| II-3 | 0.8 | No | 0.41 | 0.33 |
| II-4 | 7.8 | No | 0.16 | 0.14 |

As shown in Tables 6 to 8, Sample Nos. II-1 to 4 have good fracture resistance and oxidation resistance, and good cutting performance is exhibited.

Example 4

A throw-away tip was formed by the same method as in Example 2 except that the cemented carbide substrate of Sample No. 4 of Example 3 was used, and a coating layer shown in Table 9 was formed on a surface thereof. A cutting test was performed under the same conditions as in Example 1. The results are shown in Tables 9 and 10.

TABLE 9

| | Deposition condition | | | First layer | | Second layer | | |
|---|---|---|---|---|---|---|---|---|
| Sample No | Deposition temperature (°C.) | Bias voltage (V) | Nitrogen gas pressure (Pa) | Composition | Thickness $T_1$ (nm) | Composition | Thickness $T_2$ (nm) | Total thickness (μm) |
| II-5 | 550 | 150 | 4 | $Ti_{0.40}Al_{0.48}W_{0.04}Si_{0.05}Nb_{0.03}N$ | 45 | $Ti_{0.34}Al_{0.55}Si_{0.01}Nb_{0.10}N$ | 45 | 6.0 |
| II-6 | 500 | 95 | 5 | $Ti_{0.40}Al_{0.48}W_{0.05}Si_{0.02}Ta_{0.05}N$ | 45 | $Ti_{0.33}Al_{0.51}Si_{0.03}Ta_{0.13}N$ | 50 | 4.0 |
| II-7 | 520 | 150 | 2.5 | $Ti_{0.44}Al_{0.48}W_{0.04}Si_{0.03}Hf_{0.01}N$ | 65 | $Ti_{0.28}Al_{0.58}Si_{0.08}Hf_{0.06}N$ | 65 | 5.5 |
| II-8 | 550 | 100 | 3.5 | $Ti_{0.35}Al_{0.51}W_{0.1}Si_{0.03}Mo_{0.01}C_{0.2}N_{0.8}$ | 40 | $Ti_{0.32}Al_{0.59}Si_{0.01}Nb_{0.08}C_{0.3}N_{0.7}$ | 50 | 3.5 |

TABLE 10

| | Cutting characteristic | | |
|---|---|---|---|
| Sample No | Chipping | Flank wear (mm) | Nose wear (mm) |
| II-5 | No | 0.19 | 0.13 |
| II-6 | No | 0.20 | 0.19 |
| II-7 | No | 0.24 | 0.29 |
| II-8 | Microchipping | 0.30 | 0.34 |

In Sample Nos. II-5 to 8, the coating layers have good fracture resistance and oxidation resistance, and good cutting performance is exhibited.

Example 5

An $Al_2O_3$ powder having an average particle diameter of 0.5 μm, a MgO powder having an average particle diameter of 1 μm, a CoO powder having an average particle diameter of 1 μm, and a NiO powder having an average particle diameter of 1 μm were prepared as shown in Table 11, and these powders were mixed with a ball mill using $Al_2O_3$ balls for 72 hours. The resultant powder mixture was molded by press molding under pressure of 98 MPa into a throw away tip shape of JIS CNGA120408. The molded body was subjected to debinding and fired in a nonoxidative atmosphere of Ar gas at 0.04 MPa and at 1650° C. to prepare an $Al_2O_3$ based ceramic substrate. In addition, both main surfaces of the $Al_2O_3$ based ceramic substrate were polished, and the cutting edge portion of the substrate was subjected to honing edge using a diamond wheel to form horning R of R=0.02 vtm at the cutting edge.

First and second targets for depositing the first layer and second layer shown in Table 12 were disposed to face the substrate prepared as described above in a deposition apparatus. Then, a bias voltage was applied using the first target under the first layer deposition conditions and then using the second target under the second layer deposition conditions to form a coating layer on each sample under the deposition conditions shown in Table 12. For Sample No. III-7, the sample was set outside the region where other samples faced the targets.

For each of the resulting samples, the coating layer was evaluated by the same method as in example 1, and a cutting test was performed using the resulting throw-away tip (cutting tool) with a cutting tool shape under the following conditions. The results are shown in Tables 12 and 13.

Tip shape: CNGN 120408

Workpiece: SKD11 hardened steel (HRC=58-60)

Peripheral speed (Vc): 100 m/min

Feed (f): 0.1 mm/rev

Depth of cut (ap): 0.5 (mm)

Cutting condition: dry machining

Evaluation item: In turning with a peripheral cutting length of 200 mm with φ200 to φ150, a wear amount was measured after machining for 90 minute.

TABLE 11

| | Prepared composition (% by mass) | | | | | | Interfacial |
|---|---|---|---|---|---|---|---|
| Sample No | $Al_2O_3$ | MgO | Other additive | | CoO | NiO | Co + Ni | roughness (μm) |
| III-1 | Balance | 0.2 | TiC | 42 | 0.2 | 0.04 | 0.24 | 0.12 |
| III-2 | Balance | 0.3 | TiCN | 31 | 1.4 | 0 | 1.4 | 0.22 |
| III-3 | Balance | 0.5 | TiC | 70 | 0.05 | 0.07 | 0.12 | 0.14 |
| III-4 | Balance | 0 | SiC | 30.2 | 0.14 | 0.02 | 0.16 | 0.21 |
| III-5 | Balance | 2 | TiC | 53 | 0.4 | 0 | 0.4 | 0.24 |
| III-6 | Balance | 0.2 | TiCN | 63 | 0.2 | 0.2 | 0.4 | 0.16 |
| III-7 | Balance | 0.3 | SiC | 10 | 0.6 | 0.6 | 1.2 | 0.24 |
| III-8 | Balance | 0.1 | TiC | 29.8 | 0.9 | 0.3 | 1.2 | 0.29 |
| III-9 | Balance | 0.5 | TiC | 71 | 2 | 0.5 | 2.5 | 0.1 |
| III-10 | Balance | 0.7 | TiC | 8 | 0.5 | 0 | 0.5 | 0.4 |
| III-11 | Balance | 0.1 | TiC | 29.8 | 0.05 | 0 | 0.05 | 0.5 |
| III-12 | Balance | 0.2 | TiC | 41.5 | 1.5 | 1 | 2.5 | 0.2 |
| III-13 | Balance | 0.3 | TiC | 6.7 | 0.3 | 0.2 | 0.5 | 0.4 |
| III-14 | Balance | 0.7 | TiC | 26.5 | 0 | 0.1 | 0.1 | 0.14 |
| III-15 | Balance | 0.3 | TiCN | 77 | 0.2 | 0 | 0.2 | 0.22 |
| III-16 | Balance | 0.2 | TiC | 21.6 | 0.1 | 0.4 | 0.5 | 0.1 |
| III-17 | Balance | 0.1 | TiC | 10.6 | 0.3 | 0.1 | 0.4 | 0.06 |

TABLE 12

| Sample No | First layer deposition condition | | | Second layer deposition condition | | | First layer |
|---|---|---|---|---|---|---|---|
| | Deposition temperature (°C.) | Bias voltage (V) | Nitrogen gas pressure (Pa) | Deposition temperature (°C.) | Bias voltage (V) | Nitrogen gas pressure (Pa) | Composition |
| III-1 | 550 | 125 | 3 | 600 | 150 | 1.5 | $Ti_{0.41}Al_{0.50}W_{0.01}Mo_{0.05}Si_{0.03}N$ |
| III-2 | 400 | 100 | 3.5 | 550 | 125 | 2 | $Ti_{0.44}Al_{0.48}W_{0.04}Si_{0.03}Hf_{0.01}N$ |
| III-3 | 550 | 150 | 2 | 500 | 100 | 1.2 | $Ti_{0.40}Al_{0.49}W_{0.04}Si_{0.04}Nb_{0.03}N$ |
| III-4 | 520 | 100 | 2.8 | 550 | 175 | 0.7 | $Ti_{0.41}Al_{0.48}W_{0.05}Si_{0.03}Y_{0.03}N$ |
| III-5 | 530 | 75 | 3.8 | 550 | 100 | 1.9 | $Ti_{0.37}Al_{0.54}W_{0.05}Si_{0.03}Mo_{0.01}C_{0.2}N_{0.8}$ |
| III-6 | 600 | 30 | 5 | 550 | 200 | 0.2 | $Ti_{0.37}Al_{0.53}W_{0.01}Mo_{0.04}Si_{0.05}N$ |
| III-7 | 480 | 200 | 4.2 | 550 | 175 | 2 | $Ti_{0.42}Al_{0.46}W_{0.05}Ta_{0.07}N$ |
| III-8 | 580 | 125 | 3.5 | 550 | 150 | 1.5 | $Ti_{0.40}Al_{0.50}W_{0.03}Si_{0.03}Nb_{0.04}N$ |
| III-9 | 500 | 125 | 3.5 | 550 | 100 | 1 | $Ti_{0.42}Al_{0.48}W_{0.05}Si_{0.03}Ta_{0.02}N$ |
| III-10 | 550 | 100 | 2.9 | 500 | 125 | 3.5 | $Ti_{0.42}Al_{0.49}W_{0.04}Si_{0.03}Y_{0.02}N$ |
| III-11 | 450 | 75 | 3.5 | 500 | 100 | 0.5 | $Ti_{0.38}Al_{0.52}W_{0.05}Si_{0.03}Nb_{0.02}N$ |
| III-12 | 500 | 200 | 3 | 520 | 200 | 3 | $Ti_{0.44}Al_{0.48}W_{0.04}Si_{0.02}Hf_{0.02}N$ |
| III-13 | 525 | 220 | 3.2 | — | — | — | $Ti_{0.43}Al_{0.45}W_{0.04}Si_{0.04}Ta_{0.04}N$ |
| III-14 | 560 | 125 | 6.5 | 450 | 100 | 1.5 | $Ti_{0.27}Al_{0.54}Si_{0.03}Nb_{0.16}N$ |
| III-15 | 500 | 50 | 4.5 | 450 | 150 | 2.6 | $Ti_{0.43}Al_{0.45}W_{0.04}Si_{0.04}Hf_{0.04}N$ |
| III-16 | 350 | 75 | 3.6 | 600 | 125 | 3.5 | $Ti_{0.37}Al_{0.51}Cr_{0.05}W_{0.04}Si_{0.03}N$ |
| III-17 | 520 | 120 | 3.5 | 550 | 120 | 1.1 | $Ti_{0.37}Al_{0.49}W_{0.02}Si_{0.08}Mo_{0.04}N$ |

| Sample No | First Layer | | | Second layer | | | Total thickness (μm) |
|---|---|---|---|---|---|---|---|
| | Average crystal width (μm) | Thickness $t_1$ (μm) | Average particle diameter of dispersed particle (μm) | Composition | Average crystal width (μm) | Thickness $t_2$ (μm) | |
| III-1 | 0.23 | 3.0 | 0.2 | $Ti_{0.33}Al_{0.55}Si_{0.02}Hf_{0.10}N$ | 1.2 | 2.3 | 5.3 |
| III-2 | 0.21 | 4.0 | No | $Ti_{0.34}Al_{0.54}Si_{0.02}Y_{0.10}N$ | 2.2 | 2.6 | 6.6 |
| III-3 | 0.20 | 3.3 | 0.22 | $Ti_{0.34}Al_{0.54}Si_{0.02}Mo_{0.10}N$ | 1.8 | 1.9 | 5.2 |
| III-4 | 0.30 | 3.6 | 0.20 | $Ti_{0.30}Al_{0.59}Si_{0.03}Nb_{0.08}N$ | 2.5 | 1.3 | 4.9 |
| III-5 | 0.32 | 4.2 | 0.16 | $Ti_{0.35}Al_{0.55}Si_{0.03}Ta_{0.07}N$ | 1.8 | 1.6 | 5.8 |
| III-6 | 0.4 | 4.5 | 0.05 | $Ti_{0.35}Al_{0.59}Si_{0.05}Nb_{0.01}C_{0.3}N_{0.7}$ | 2.7 | 3.5 | 8.0 |
| III-7 | 0.22 | 3.5 | 0.09 | $Ti_{0.35}Al_{0.50}Si_{0.02}Mo_{0.13}N$ | 1.2 | 0.8 | 4.3 |
| III-8 | 0.42 | 3.6 | 0.48 | $Ti_{0.34}Al_{0.55}Si_{0.01}Nb_{0.10}N$ | 1.1 | 2.3 | 5.9 |
| III-9 | 0.25 | 4.2 | 0.35 | $Ti_{0.31}Al_{0.56}Si_{0.02}Y_{0.11}N$ | 1.6 | 2.6 | 6.8 |
| III-10 | 0.33 | 3.1 | 0.11 | $Ti_{0.33}Al_{0.55}Si_{0.04}Nb_{0.08}C_{0.3}N_{0.7}$ | 2 | 1.6 | 4.7 |
| III-11 | 0.26 | 4.6 | 0.41 | $Ti_{0.41}Al_{0.43}Si_{0.05}Ta_{0.11}N$ | 1.1 | 2.0 | 6.6 |
| III-12 | 0.41 | 3.3 | 0.09 | $Ti_{0.39}Al_{0.48}Si_{0.05}Nb_{0.08}N$ | 1.6 | 2.3 | 5.6 |
| III-13 | 1.4 | 5.0 | 0.26 | — | — | — | 5.0 |
| III-14 | 0.36 | 4.1 | 0.03 | $Ti_{0.41}Al_{0.50}W_{0.40}Si_{0.02}Mo_{0.03}N$ | 1.8 | 2.5 | 6.6 |
| III-15 | 0.5 | 3.5 | No | $Ti_{0.42}Al_{0.48}W_{0.03}Si_{0.02}Mo_{0.05}N$ | 0.12 | 3.1 | 6.6 |
| III-16 | 0.3 | 3.7 | 0.05 | $(Ti_{0.45}Al_{0.55})(N_{0.8}O_{0.2})$ | 2.5 | 1.3 | 5.0 |
| III-17 | 2.5 | 3.0 | No | $Ti_{0.33}Al_{0.56}Si_{0.01}Nb_{0.10}N$ | 2.3 | 1.1 | 4.1 |

TABLE 13

| Sample No | Ratio of droplet (area %) | Cutting characteristic | | |
|---|---|---|---|---|
| | | Chipping | Flank wear (mm) | Nose wear (mm) |
| III-1 | 10.5 | No | 0.15 | 0.16 |
| III-2 | 9.2 | No | 0.18 | 0.16 |
| III-3 | 21.3 | No | 0.19 | 0.19 |
| III-4 | 16.5 | No | 0.21 | 0.22 |
| III-5 | 24.6 | | 0.22 | 0.25 |
| III-6 | 0.7 | No | 0.24 | 0.31 |
| III-7 | 0.8 | | 0.30 | 0.34 |
| III-8 | 7.8 | No | 0.12 | 0.14 |
| III-9 | 23.5 | No | 0.31 | 0.28 |
| III-10 | 16.8 | No | 0.32 | 0.34 |
| III-11 | 12.4 | Microchipping | 0.34 | 0.35 |
| III-12 | 15.5 | No | 0.34 | 0.38 |
| III-13 | 23.0 | Microchipping | 0.52 | 0.56 |
| III-14 | 22.4 | Chipping (delamination) | 0.36 | 0.41 |
| III-15 | 16.7 | Early fracture | — | — |
| III-16 | 5.4 | Microchipping | 0.42 | 0.39 |
| III-17 | 14.6 | Microchipping | 0.54 | 0.55 |

In contrast, in Sample Nos. III-1 to 8, the coating layers have good fracture resistance and oxidation resistance, and good cutting performance is exhibited.

Example 6

In contrast to Sample No. III-1 in Example 5, the coating layer including following compositions was deposited. That is, first and second targets for depositing the first layer and second layer shown in Table 14 were disposed to face each other in a deposition apparatus. A cutting tool was formed by the same method as Sample No. III-1 in Example 5 except for a method of forming a coating layer. In the method of forming a coating layer, a sample support set in the apparatus was rotated while plasma was generated from both targets under the deposition conditions shown in Table 14, forming a coating layer in which the first and second layers were alternately laminated with the thickness period shown in Table 14. The cutting performance was evaluated by the same method as III-1 in Example 5. The results are shown in Table 15.

solvent was removed by drying to prepare a granulated powder, and the granulated powder was press-molded into a cutting tool shape of SNGN120412 under a molding pressure shown in Table 6.

When the molded product was set in a crucible, under a condition in which a mixed powder comprising at least one of a $Si_3N_4$ powder, a Si powder, and a $SiO_2$ powder and a $Mg(OH)_2$ powder was charged in the crucible, the molded product was set, and the crucible was covered. The crucible was placed in a carbon cylinder and then placed in a firing

TABLE 14

| | Deposition condition | | | First layer | | Second layer | | |
|---|---|---|---|---|---|---|---|---|
| Sample No | Deposition temperature (° C.) | Bias voltage (V) | Nitrogen gas pressure (Pa) | Composition | Thickness $T_1$ (nm) | Composition | Thickness $T_2$ (nm) | Total thickness (μm) |
| III-18 | 550 | 150 | 4 | $Ti_{0.40}Al_{0.49}W_{0.06}Si_{0.02}Nb_{0.03}N$ | 45 | $Ti_{0.34}Al_{0.55}Si_{0.01}Nb_{0.10}N$ | 45 | 6.0 |
| III-19 | 550 | 125 | 3.0 | $Ti_{0.34}Al_{0.50}W_{0.08}Mo_{0.05}Si_{0.03}N$ | 45 | $Ti_{0.31}Al_{0.54}Si_{0.05}Mo_{0.1}N$ | 40 | 10.0 |
| III-20 | 500 | 125 | 3.0 | $Ti_{0.36}Al_{0.48}W_{0.06}Si_{0.03}Nb_{0.07}N$ | 55 | $Ti_{0.32}Al_{0.53}Si_{0.05}Nb_{0.05}Mo_{0.05}N$ | 55 | 7.5 |
| III-21 | 500 | 125 | 4.5 | $Ti_{0.37}Al_{0.52}W_{0.04}Si_{0.03}Nb_{0.04}N$ | 55 | $Ti_{0.23}Al_{0.6}Si_{0.04}Y_{0.13}N$ | 50 | 8.5 |
| III-22 | 550 | 100 | 3.5 | $Ti_{0.35}Al_{0.51}W_{0.07}Si_{0.03}Ta_{0.04}C_{0.2}N_{0.8}$ | 40 | $Ti_{0.39}Al_{0.52}Si_{0.01}Ta_{0.08}C_{0.3}N_{0.7}$ | 50 | 3.5 |
| III-23 | 500 | 100 | 4 | $Ti_{0.41}Al_{0.50}W_{0.04}Si_{0.02}Mo_{0.03}N$ | 45 | — | | 4.0 |
| III-24 | 500 | 75 | 2.5 | $Ti_{0.43}Al_{0.42}Si_{0.05}W_{0.1}N$ | 60 | $Ti_{0.34}Al_{0.55}Si_{0.04}Nb_{0.07}N$ | 55 | 6.0 |
| III-25 | 500 | 125 | 4 | $Ti_{0.40}Al_{0.46}Si_{0.09}Nb_{0.05}N$ | 55 | $Ti_{0.27}Al_{0.54}Si_{0.03}Nb_{0.16}N$ | 60 | 5.0 |
| III-26 | 550 | 100 | 4.5 | $Ti_{0.45}Al_{0.51}W_{0.02}Si_{0.01}Mo_{0.01}N$ | 60 | $Ti_{0.41}Al_{0.50}W_{0.03}Si_{0.02}Mo_{0.04}N$ | 50 | 4.0 |
| III-27 | 500 | 75 | 4.0 | $Ti_{0.30}Al_{0.53}Si_{0.02}Nb_{0.15}N$ | 45 | $(Ti_{0.45}Al_{0.55})_{0.5}(N_{0.8}O_{0.2})_{0.6}$ | 50 | 6.0 |

TABLE 15

| | | Cutting characteristic | | |
|---|---|---|---|---|
| Sample No | Ratio of droplet (area %) | Chipping | Flank wear (mm) | Nose wear (mm) |
| III-18 | 12.4 | No | 0.14 | 0.13 |
| III-19 | 18.5 | No | 0.23 | 0.25 |
| III-20 | 9.5 | No | 0.16 | 0.17 |
| III-21 | 22.1 | Microchipping | 0.24 | 0.28 |
| III-22 | 14.2 | No | 0.24 | 0.25 |
| III-23 | 15.1 | Microchipping | 0.45 | 0.48 |
| III-24 | 6.2 | Chipping (delamination) | 0.30 | 0.33 |
| III-25 | 27.1 | Early fracture | — | — |
| III-26 | 45.8 | Microchipping | 0.34 | 0.39 |
| III-27 | 35.1 | Microchipping | 0.39 | 0.42 |

The results shown in Tables 14 and 15 indicate that in Sample Nos. III-23 to 27 including the coating layers, fracture resistance and wear resistance are poor. In contrast, in Sample Nos. III-18 to 22, the coating layers have good fracture resistance and oxidation resistance, and good cutting performance is exhibited.

Example 7

A silicon nitride ($Si_3N_4$) powder having an average particle diameter of 0.3 μm, a rare earth (RE) element compound (any one of lanthanum hydroxide ($La(OH)_2$), yttrium oxide ($Y_2O_3$), ytterbium oxide ($Yb_2O_3$), erbium oxide ($Er_2O_3$) and cerium oxide ($Ce_2O_3$)) powder having an average particle diameter of 1.2 μm, an aluminum oxide ($Al_2O_3$) powder having an average particle diameter of 0.7 μm, and a magnesium hydroxide ($Mg(OH)_2$) powder having an average particle diameter of 2.5 μm were prepared as starting raw materials at the ratio shown in Table 16. Then, a binder and a solvent were added to the materials, and these materials were ground and mixed with an attritor mill for 70 hours. Then, the furnace. Then, the inside of the firing furnace was replaced with 1 atmosphere nitrogen, and after degreasing, the temperature was increased at a heating rate of 10° C./min. Firing was performed at 1800° C. for 6 hours. The atmosphere during firing was controlled to 1 atmosphere nitrogen. Then, hot isostatic firing (HIP) was performed at 1600° C. and 196 MPa for 2 hours, and further the surface of the sintered body was polished for a thickness of 0.3 mm (double head grinding and periphery grinding) to prepare a $Si_3N_4$ based ceramic substrate. In addition, both main surfaces of the $Si_3N_4$ based ceramic substrate were polished, and the cutting edge portion of the substrate was subjected to honing edge using a diamond wheel to form horning R of R=0.02 μm at the cutting edge.

First and second targets for depositing the first layer and second layer shown in Table 17 were disposed to face the substrate prepared as described above in a deposition apparatus. Then, a bias voltage was applied using the first target under the first layer deposition conditions and then using the second target under the second layer deposition conditions to form a coating layer on each sample under the deposition conditions shown in Table 17. For Sample No. IV-7, the sample was set outside the region where other samples faced the targets.

For each of the resulting samples, the coating layer was evaluated by the same method as in example 1, and a cutting test was conducted using the resulting throw-away tip (cutting tool) with a cutting tool shape under the following cutting conditions. The results are shown in Tables 17 and 18.
Tip shape: SNGN120412
Workpiece: FC250
Cutting method: turning
Cutting speed: 550 m/min
Feed: 0.5 mm/rev
Depth of cut: 2.0 mm
Cutting condition: wet machining
Evaluation method: After cutting for 2 minutes, flank wear and nose wear, and chipping were measured by a microscope.

TABLE 16

| Sample No | Whole composition of sintered body (% by mass) | | | | | | Interfacial roughness (μm) |
|---|---|---|---|---|---|---|---|
| | Si$_3$N$_4$ | RE$_2$O$_3$ | MgO | Al$_2$O$_3$ | Oxygen | W$_2$S | |
| IV-1 | Balance | Y$_2$O$_3$ | 0.14 | 0.71 | 0.30 | 1.64 | 0 | 0.12 |
| IV-2 | Balance | Er$_2$O$_3$ | 1.3 | 1.2 | 0.36 | 2.04 | 0 | 0.22 |
| IV-3 | Balance | Yb$_2$O$_3$ | 0.15 | 0.60 | 0.25 | 1.58 | 0.3 | 0.14 |
| IV-4 | Balance | Y$_2$O$_3$ | 2.8 | 0.18 | 0.54 | 1.94 | 0.7 | 0.21 |
| IV-5 | Balance | La$_2$O$_3$ | 3.5 | 1.5 | 0.30 | 2.45 | 0.4 | 0.24 |
| IV-6 | Balance | Y$_2$O$_3$ | 0.20 | 2.5 | 0 | 2.22 | 0.3 | 0.16 |
| IV-7 | Balance | Ce$_2$O$_3$ | 4.5 | 0.25 | 0.48 | 2.19 | 0.4 | 0.24 |
| IV-8 | Balance | La$_2$O$_3$ | 0.91 | 0.68 | 0.43 | 1.81 | 0.5 | 0.29 |
| IV-9 | Balance | La$_2$O$_3$ | 4.7 | 0.42 | 0.35 | 2.22 | 0.1 | 0.1 |
| IV-10 | Balance | Y$_2$O$_3$ | 2.2 | 0.28 | 0.47 | 1.86 | 0.2 | 0.4 |
| IV-11 | Balance | Y$_2$O$_3$ | 1.2 | 2.6 | 0.50 | 2.64 | 0.3 | 0.5 |
| IV-12 | Balance | Yb$_2$O$_3$ | 0.8 | 0.43 | 0.65 | 1.79 | 0 | 0.2 |
| IV-13 | Balance | La$_2$O$_3$ | 0.85 | 0.72 | 0.43 | 1.81 | 0.5 | 0.4 |
| IV-14 | Balance | La$_2$O$_3$ | 0.95 | 0.75 | 0.41 | 1.83 | 0.5 | 0.14 |
| IV-15 | Balance | La$_2$O$_3$ | 0.90 | 0.61 | 0.40 | 1.76 | 0.5 | 0.22 |
| IV-16 | Balance | La$_2$O$_3$ | 0.80 | 0.80 | 0.47 | 1.86 | 0.5 | 0.1 |
| IV-17 | Balance | La$_2$O$_3$ | 1.0 | 0.70 | 0.39 | 1.81 | 0.5 | 0.06 |

TABLE 17

| Sample No | First layer deposition condition | | | Second layer deposition condition | | | First layer Composition |
|---|---|---|---|---|---|---|---|
| | Deposition temperature (°C.) | Bias voltage (V) | Nitrogen gas pressure (Pa) | Deposition temperature (°C.) | Bias voltage (V) | Nitrogen gas pressure (Pa) | |
| IV-1 | 550 | 125 | 2.7 | 550 | 150 | 1.5 | Ti$_{0.42}$Al$_{0.48}$W$_{0.02}$Mo$_{0.05}$Si$_{0.03}$N |
| IV-2 | 450 | 100 | 3.5 | 500 | 125 | 2 | Ti$_{0.45}$Al$_{0.48}$W$_{0.04}$Si$_{0.02}$Hf$_{0.01}$N |
| IV-3 | 500 | 150 | 2.2 | 550 | 100 | 1.2 | Ti$_{0.43}$Al$_{0.49}$W$_{0.03}$Si$_{0.03}$Nb$_{0.02}$N |
| IV-4 | 550 | 100 | 3.1 | 450 | 175 | 0.7 | Ti$_{0.43}$Al$_{0.46}$W$_{0.04}$Si$_{0.04}$Y$_{0.03}$N |
| IV-5 | 400 | 75 | 3.6 | 600 | 100 | 1.9 | Ti$_{0.33}$Al$_{0.52}$W$_{0.06}$Si$_{0.05}$Mo$_{0.04}$C$_{0.2}$N$_{0.8}$ |
| IV-6 | 550 | 30 | 4.6 | 500 | 200 | 0.2 | Ti$_{0.37}$Al$_{0.55}$W$_{0.01}$Mo$_{0.03}$Si$_{0.04}$N |
| IV-7 | 480 | 200 | 3.6 | 450 | 175 | 2 | Ti$_{0.42}$Al$_{0.48}$W$_{0.05}$Ta$_{0.05}$N |
| IV-8 | 580 | 125 | 3.3 | 500 | 150 | 1.5 | Ti$_{0.42}$Al$_{0.48}$W$_{0.03}$Si$_{0.04}$Nb$_{0.03}$N |
| IV-9 | 550 | 125 | 3.1 | 500 | 100 | 1 | Ti$_{0.40}$Al$_{0.50}$W$_{0.05}$Si$_{0.03}$Ta$_{0.02}$N |
| IV-10 | 550 | 100 | 3.8 | 450 | 125 | 3.5 | Ti$_{0.40}$Al$_{0.49}$W$_{0.04}$Si$_{0.05}$Y$_{0.02}$N |
| IV-11 | 500 | 75 | 3.7 | 550 | 100 | 0.5 | Ti$_{0.34}$Al$_{0.51}$W$_{0.05}$Si$_{0.05}$Nb$_{0.05}$N |
| IV-12 | 450 | 200 | 3.7 | 600 | 200 | 3 | Ti$_{0.42}$Al$_{0.46}$W$_{0.06}$Si$_{0.04}$Hf$_{0.02}$N |
| IV-13 | 550 | 220 | 2.8 | — | — | — | Ti$_{0.43}$Al$_{0.45}$W$_{0.04}$Si$_{0.04}$Ta$_{0.04}$N |
| IV-14 | 530 | 125 | 6.1 | 550 | 100 | 1.5 | Ti$_{0.40}$Al$_{0.45}$Si$_{0.04}$Nb$_{0.10}$N |
| IV-15 | 550 | 50 | 4.7 | 500 | 150 | 2.6 | Ti$_{0.41}$Al$_{0.42}$W$_{0.04}$Si$_{0.04}$Hf$_{0.09}$N |
| IV-16 | 400 | 75 | 3.2 | 400 | 125 | 3.5 | Ti$_{0.32}$Al$_{0.51}$Nb$_{0.12}$W$_{0.03}$Si$_{0.02}$N |
| IV-17 | 450 | 120 | 3.7 | 500 | 120 | 1.1 | Ti$_{0.40}$Al$_{0.46}$W$_{0.02}$Si$_{0.08}$Mo$_{0.04}$N |

| Sample No | First Layer | | | Second layer | | | Total thickness (μm) |
|---|---|---|---|---|---|---|---|
| | Average crystal width (μm) | Thickness t$_1$ (μm) | Average particle diameter of dispersed particle (μm) | Composition | Average crystal width (μm) | Thickness t$_2$ (μm) | |
| IV-1 | 0.22 | 3.1 | 0.4 | Ti$_{0.33}$Al$_{0.52}$Si$_{0.05}$Hf$_{0.10}$N | 2.1 | 2.2 | 5.3 |
| IV-2 | 0.19 | 3.5 | 0.27 | Ti$_{0.34}$Al$_{0.54}$Si$_{0.04}$Y$_{0.08}$N | 1.6 | 2.7 | 6.2 |
| IV-3 | 0.22 | 3.5 | 0.21 | Ti$_{0.34}$Al$_{0.53}$Si$_{0.03}$Mo$_{0.10}$N | 1.5 | 1.7 | 5.2 |
| IV-4 | 0.35 | 4.4 | 0.1 | Ti$_{0.32}$Al$_{0.60}$Si$_{0.03}$Nb$_{0.05}$N | 2.3 | 1.4 | 5.8 |
| IV-5 | 0.29 | 4.1 | 0.16 | Ti$_{0.37}$Al$_{0.51}$Si$_{0.07}$Ta$_{0.05}$N | 1.9 | 1.7 | 5.8 |
| IV-6 | 0.41 | 4.6 | No | Ti$_{0.35}$Al$_{0.57}$Nb$_{0.08}$C$_{0.3}$N$_{0.7}$ | 2.9 | 3.3 | 7.9 |
| IV-7 | 0.33 | 4.6 | 0.33 | Ti$_{0.38}$Al$_{0.53}$Si$_{0.02}$Mo$_{0.07}$N | 2.1 | 0.7 | 5.3 |
| IV-8 | 0.41 | 3.7 | 0.09 | Ti$_{0.30}$Al$_{0.53}$Si$_{0.05}$Nb$_{0.12}$N | 2.6 | 2.1 | 5.8 |
| IV-9 | 0.21 | 4.1 | 0.32 | Ti$_{0.30}$Al$_{0.57}$Si$_{0.02}$Y$_{0.11}$N | 1.9 | 2.5 | 6.6 |
| IV-10 | 0.36 | 3.1 | 0.22 | Ti$_{0.33}$Al$_{0.55}$Si$_{0.04}$Nb$_{0.08}$C$_{0.3}$N$_{0.7}$ | 2.6 | 1.4 | 4.5 |
| IV-11 | 0.22 | 4.6 | 0.41 | Ti$_{0.39}$Al$_{0.43}$Si$_{0.07}$Ta$_{0.11}$N | 1 | 1.7 | 6.3 |
| IV-12 | 0.35 | 3.6 | 0.16 | Ti$_{0.37}$Al$_{0.50}$Si$_{0.05}$Nb$_{0.08}$N | 1.6 | 2.6 | 6.2 |
| IV-13 | 1.23 | 5.1 | 0.33 | | | | 5.1 |
| IV-14 | 0.4 | 5.7 | 0.07 | Ti$_{0.43}$Al$_{0.48}$W$_{0.04}$Si$_{0.02}$Mo$_{0.03}$N | 2.1 | 2.5 | 8.2 |
| IV-15 | 0.6 | 3.1 | No | Ti$_{0.43}$Al$_{0.50}$Si$_{0.02}$Mo$_{0.05}$N | 0.3 | 2.5 | 5.6 |

TABLE 17-continued

| | | | | | | | |
|---|---|---|---|---|---|---|---|
| IV-16 | 0.35 | 3.6 | 0.04 | $(Ti_{0.45}Al_{0.55})_{0.5}(N_{0.8}O_{0.2})_{0.6}$ | 2.1 | 1.7 | 5.3 |
| IV-17 | 2.1 | 3.7 | No | $Ti_{0.31}Al_{0.56}Si_{0.03}Nb_{0.10}N$ | 2.2 | 1.0 | 4.7 |

TABLE 18

| Sample No | Ratio of droplet (area %) | Cutting characteristic | | |
|---|---|---|---|---|
| | | Chipping | Flank wear (mm) | Nose wear (mm) |
| IV-1 | 10.5 | No | 0.14 | 0.17 |
| IV-2 | 9.2 | No | 0.21 | 0.19 |
| IV-3 | 22.1 | No | 0.23 | 0.24 |
| IV-4 | 16.5 | No | 0.26 | 0.26 |
| IV-5 | 17.7 | No | 0.29 | 0.26 | second layer shown in Table 19 were disposed to face each other in a deposition apparatus. A cutting tool was formed by the same method as Sample No. IV-1 in Example 7 except for a method of forming a coating layer. In the method of forming a coating layer, a sample support set in the apparatus was rotated while plasma was generated from both targets under the deposition conditions shown in Table 19, forming a coating layer in which the first and second layers were alternately laminated with the thickness period shown in Table 19. The cutting performance was evaluated by the same method as IV-1 in Example 7. The results are shown in Table 20.

TABLE 19

| | Deposition condition | | | First layer | | Second layer | | |
|---|---|---|---|---|---|---|---|---|
| Sample No | Deposition temperature (° C.) | Bias voltage (V) | Nitrogen gas pressure (Pa) | Composition | Thickness $T_1$ (nm) | Composition | Thickness $T_2$ (nm) | Total thickness (μm) |
| IV-18 | 500 | 125 | 3.7 | $Ti_{0.38}Al_{0.49}W_{0.06}Si_{0.02}Nb_{0.05}N$ | 40 | $Ti_{0.37}Al_{0.55}Si_{0.01}Nb_{0.07}N$ | 55 | 5.1 |
| IV-19 | 550 | 150 | 3.8 | $Ti_{0.32}Al_{0.50}W_{0.06}Mo_{0.07}Si_{0.05}N$ | 50 | $Ti_{0.35}Al_{0.50}Si_{0.05}Mo_{0.10}N$ | 45 | 11.1 |
| IV-20 | 525 | 100 | 2.7 | $Ti_{0.33}Al_{0.49}W_{0.05}Si_{0.03}Nb_{0.10}N$ | 55 | $Ti_{0.34}Al_{0.55}Si_{0.05}Nb_{0.03}Mo_{0.03}N$ | 55 | 5.6 |
| IV-21 | 490 | 150 | 4.8 | $Ti_{0.34}Al_{0.52}W_{0.05}Si_{0.04}Nb_{0.05}N$ | 45 | $Ti_{0.23}Al_{0.6}Si_{0.07}Y_{0.10}N$ | 45 | 4.7 |
| IV-22 | 500 | 75 | 3.6 | $Ti_{0.35}Al_{0.51}W_{0.08}Si_{0.03}Ta_{0.03}C_{0.2}N_{0.8}$ | 55 | $Ti_{0.41}Al_{0.50}Si_{0.01}Ta_{0.08}C_{0.3}N_{0.7}$ | 55 | 6.1 |
| IV-23 | 550 | 125 | 3.7 | $Ti_{0.40}Al_{0.51}W_{0.04}Si_{0.02}Mo_{0.03}N$ | 45 | — | | 4.6 |
| IV-24 | 450 | 140 | 2.3 | $Ti_{0.43}Al_{0.44}Si_{0.03}W_{0.10}N$ | 65 | $Ti_{0.32}Al_{0.57}Si_{0.02}Nb_{0.09}N$ | 60 | 7.6 |
| IV-25 | 550 | 125 | 4.1 | $Ti_{0.40}Al_{0.44}Si_{0.09}Nb_{0.07}N$ | 55 | $Ti_{0.29}Al_{0.54}Si_{0.06}Nb_{0.11}N$ | 55 | 3.9 |
| IV-26 | 600 | 150 | 4.9 | $Ti_{0.41}Al_{0.51}W_{0.02}Si_{0.03}Mo_{0.03}N$ | 55 | $Ti_{0.44}Al_{0.50}W_{0.03}Si_{0.02}Mo_{0.01}N$ | 60 | 4.1 |
| IV-27 | 550 | 120 | 4.0 | $Ti_{0.30}Al_{0.50}Si_{0.05}Nb_{0.15}N$ | 50 | $(Ti_{0.46}Al_{0.54})_{0.5}(N_{0.8}O_{0.2})_{0.6}$ | 45 | 4.9 |

TABLE 18-continued

| Sample No | Ratio of droplet (area %) | Cutting characteristic | | |
|---|---|---|---|---|
| | | Chipping | Flank wear (mm) | Nose wear (mm) |
| IV-6 | 0.7 | No | 0.32 | 0.31 |
| IV-7 | 0.7 | Microchipping | 0.33 | 0.34 |
| IV-8 | 6.1 | No | 0.14 | 0.12 |
| IV-9 | 35.6 | No | 0.37 | 0.38 |
| IV-10 | 16.0 | Microchipping | 0.45 | 0.41 |
| IV-11 | 12.4 | No | 0.38 | 0.40 |
| IV-12 | 15.5 | No | 0.40 | 0.36 |
| IV-13 | 23.0 | Microchipping | 0.51 | 0.53 |
| IV-14 | 21.5 | Chipping (delamination) | 0.55 | 0.47 |
| IV-15 | 16.7 | Early fracture | — | — |
| IV-16 | 5.4 | Chipping (delamination) | 0.49 | 0.45 |
| IV-17 | 14.6 | Microchipping | 0.51 | 0.46 |

The results shown in Tables 16 to 18 indicate that in Sample Nos. IV-13 to 17 including the coating layers, fracture resistance and wear resistance are poor. In contrast, in Sample Nos. IV-1 to 12, the coating layers have good fracture resistance and oxidation resistance, and good cutting performance is exhibited.

Example 8

In contrast to Sample No. IV-1 in Example 7, the coating layer including following compositions was deposited. That is, first and second targets for depositing the first layer and

TABLE 20

| Sample No | Cutting characteristic | | |
|---|---|---|---|
| | Chipping | Flank wear (mm) | Nose wear (mm) |
| IV-18 | No | 0.13 | 0.12 |
| IV-19 | No | 0.19 | 0.20 |
| IV-20 | No | 0.15 | 0.16 |
| IV-21 | Microchipping | 0.26 | 0.28 |
| IV-22 | No | 0.27 | 0.31 |
| IV-23 | Microchipping | 0.44 | 0.48 |
| IV-24 | Chipping (delamination) | 0.34 | 0.35 |
| IV-25 | Early fracture | — | — |
| IV-26 | Microchipping | 0.39 | 0.41 |
| IV-27 | Microchipping | 0.44 | 0.40 |

The results shown in Tables 19 and 20 indicate that in Sample Nos. IV-23 to 27 including the coating layers, fracture resistance and wear resistance are poor. In contrast, in Sample Nos. IV-18 to 22, the coating layers have good fracture resistance and oxidation resistance, and good cutting performance is exhibited.

Example 9

A coarse particle cBN raw material powder having an average particle diameter of 5 μm, a fine particle cBN raw material powder having an average particle diameter of 0.8 μm, a TiC raw material powder having an average particle diameter of 1.0 μm, a $Mo_2C$ raw material powder having an average particle diameter of 1.2 μm, a $Cr_3C_2$ raw material powder having an average particle diameter of 1.5 μm, a ZrC raw material powder having an average particle diameter of 1.2 μm, a TaC raw material powder having an average particle diameter of 1.2 μm, a WC raw material powder having an average particle diameter of 0.9 μm, a HfC raw material powder having an average particle diameter of 1.0 μm, a metallic Al raw material powder having an average particle diameter of 1.5 μm, and a metallic Co raw material powder having an average particle diameter of 0.8 μm were prepared to obtain each of the compositions shown in Table 21. Then, these powders were mixed with a ball mill using alumina balls for 15 hours. Then, the mixed powder was press-molded under a pressure of 98 MPa. The molded product was heated using a high-pressure/high-temperature sintering apparatus at a heating rate shown in Table 21 and fired at a pressure of 5.0 GPa at a firing temperature for time shown in Table 21. Then, the molded product was fired by cooling at a cooling rate shown in Table 21 to prepare a cBN based sintered body. In addition, the prepared sintered body was cut into predetermined dimensions by wire discharge machining and brazed to a step formed at the end of the cutting edge portion of the cemented carbide substrate. Then, the cutting edge of the cBN based sintered body was subjected to honing edge (chamfer honing) using a diamond wheel.

Then, a coating layer was deposited by an arc ion plating method on the substrate (JIS CNGA120408 throw away tip shape) formed as described above. The specific method was as follows. The substrate was set in an arc ion plating apparatus and heated to 500° C., and then coating layers having the compositions shown in Table 22 were deposited in order in an atmosphere of nitrogen gas at 2.5 Pa, with an arc current of 100 Å, and at a bias voltage of 50 V and a heating temperature of 500° C. The compositions of the coating layers were measured by the same method as in Example 1. The measurement results are shown as the compositions of the coating layers in Table 22.

The particle diameter of the cBN particles was determined as follows: First, a scanning electron microphotograph of a section of a cBN based sintered body was taken, and the area of each of 20 or more cBN particles was determined from the photograph by an image analysis method. Next, the particle diameter of the cBN particles was calculated according to the method for measuring an average particle diameter of a cemented carbide defined by CIS-019D-2005. Then, a particle size distribution of the cBN particles was measured, and it was confirmed whether or not the distribution had two peaks. When the distribution had two peaks, the particle size at the peak top on the coarse particle side and the particle size at the peak top on the fine particle side are shown in Table 21.

Next, a cutting test was conducted using the resulting throw-away tip of a grooved cutting tool shape under the following cutting conditions. The results are shown in Table 23.

Cutting method: In turning of peripheral cutting
Workpiece: FC250 with four grooves
Cutting speed: 500 m/min
Feed: 0.2 mm/rev
cutting width: 0.2 mm, cutting depth 0.4 mm
Cutting condition: dry machining
Evaluation method: The number of workpieces machined until machining was made unable due to the occurrence of a wear width of 0.1 mm or chipping.

TABLE 21

| Sample No | Prepared composition (% by volume) | | | | | | | Firing condition | | | |
|---|---|---|---|---|---|---|---|---|---|---|---|
| | cBN | Coarse particle 5 μm | Fine particle 0.8 μm | Binder phase | | | | Heating rate (° C./min) | Firing temperature (° C.) | Firing time (min) | Cooling rate (° C./min) |
| V-1 | 82 | 22 | 60 | TiC: 14 | Al: 4 | — | — | 60 | 1500 | 15 | 50 |
| V-2 | 70 | 20 | 50 | TiC: 12 | HfC: 12 | Al: 6 | — | 50 | 1450 | 15 | 50 |
| V-3 | 92 | 17 | 75 | TiC: 4 | Mo$_2$C: 1 | Al: 2 | Ni: 1 | 40 | 1600 | 30 | 30 |
| V-4 | 73 | 16 | 62 | TiC: 14 | Al: 6 | WC: 5 | Co: 2 | 60 | 1450 | 15 | 50 |
| V-5 | 84 | 32 | 52 | TiC: 6 | TiN: 6 | Al: 4 | — | 55 | 1450 | 30 | 40 |
| V-6 | 74 | 14 | 60 | NbC: 10 | NbN: 6 | Al: 10 | — | 60 | 1550 | 30 | 50 |
| V-7 | 78 | 39 | 39 | Mo2C: 10 | TiN: 7 | Al: 5 | — | 40 | 1600 | 15 | 30 |
| V-8 | 80 | 30 | 50 | TiC: 8 | TiN: 6 | Al: 4 | Co: 2 | 45 | 1500 | 20 | 30 |
| V-9 | 92 | 42 | 50 | Al: 4 | Co: 4 | — | — | 60 | 1550 | 60 | 50 |
| V-10 | 69 | 44 | 25 | TiC: 21 | Al: 8 | Co: 2 | — | 50 | 1400 | 20 | 40 |
| V-11 | 77 | 35 | 42 | TiC: 14 | Cr$_3$C$_2$: 4 | Al: 5 | — | 50 | 1350 | 30 | 50 |
| V-12 | 86 | 86 | — | TiC: 11 | Al: 3 | — | — | 50 | 1400 | 30 | 50 |
| V-13 | 80 | — | 80 | TiC: 10 | TaC: 4 | Al: 4 | Co: 2 | 40 | 1400 | 40 | 40 |
| V-14 | 88 | 2 μm 88% by volume | | TiC: 8 | Al: 4 | — | — | 30 | 1500 | 30 | 30 |
| V-15 | 78 | 23 | 55 | TiC: 18 | Al: 4 | — | — | 60 | 1500 | 15 | 50 |
| V-16 | 70 | 20 | 52 | ZrC: 12 | HfC: 10 | Al: 8 | — | 50 | 1550 | 15 | 50 |
| V-17 | 92 | 16 | 76 | TiC: 4 | Mo$_2$C: 1 | Al: 2 | Co: 1 | 40 | 1600 | 30 | 30 |
| V-18 | 73 | 20 | 53 | TiC: 16 | Al: 4 | WC: 5 | Co: 2 | 60 | 1450 | 15 | 50 |
| V-19 | 80 | 30 | 50 | TiC: 8 | TiN: 8 | Al: 4 | — | 55 | 1500 | 30 | 40 |
| V-20 | 82 | 41 | 41 | TiC: 10 | TaC: 3 | Al: 5 | — | 40 | 1500 | 15 | 30 |

| Sample No | Composition of sintered body (% by volume) | | | | | | | |
|---|---|---|---|---|---|---|---|---|
| | cBN | Coarse particle peak (μm) | Fine particle peak (μm) | Binder phase | | | | |
| V-1 | 78 | 4.5 | 0.71 | TiC: 12 | AlN: 4 | TiB$_2$: 6 | — | — |
| V-2 | 68 | 4.7 | 0.78 | TiC: 10 | HfC: 11 | AlN: 5 | TiB$_2$: 6 | — |
| V-3 | 91 | 4.3 | 0.67 | TiC: 3 | Mo$_2$C: 1 | AlN: 2 | TiB$_2$: 2 | Ni: 1 |
| V-4 | 71 | 4.7 | 0.76 | TiC: 12 | AlN: 6 | WC: 5 | Co: 2 | TiB$_2$: 4 |
| V-5 | 81 | 5.8 | 1 | TiC: 5 | TiN: 6 | AlN: 4 | TiB$_2$: 4 | — |

TABLE 21-continued

| | | | | | | | | |
|---|---|---|---|---|---|---|---|---|
| V-6 | 70 | 4.2 | 0.62 | NbC: 8 | NbN: 6 | AlN: 10 | NbB$_2$: 4 | Co: 2 |
| V-7 | 76 | 5.5 | 0.89 | Mo$_2$C: 10 | TiN: 5 | AlN: 5 | TiB$_2$: 2 | Co: 2 |
| V-8 | 78 | 5 | 0.93 | TiCN: 12 | TiB$_2$: 4 | AlN: 4 | Co: 2 | — |
| V-9 | 91 | 4.5 | 0.70 | AlN: 3 | AlB$_2$: 2 | Co: 4 | — | — |
| V-10 | 69 | 4.8 | 0.80 | TiC: 18 | AlN: 6 | Co: 2 | TiB$_2$: 5 | — |
| V-11 | 75 | 4.9 | 0.81 | TiC: 12 | Cr$_3$C$_2$: 4 | Al$_2$O$_3$: 4 | TiB$_2$: 5 | — |
| V-12 | 85 | 5.0 | — | TiC: 11 | AlN: 3 | TiB$_2$: 1 | | |
| V-13 | 78 | — | 0.79 | TiC: 9 | TaC: 4 | AlN: 4 | TiB$_2$: 3 | Co: 2 |
| V-14 | 87 | 1.92 | | TiC: 7 | AlN: 4 | TiB$_2$: 1 | Co: 1 | — |
| V-15 | 77 | 4.2 | 0.75 | TiC: 16 | AlN: 3 | TiB$_2$: 3 | Co: 1 | — |
| V-16 | 69 | 4.3 | 0.73 | ZrC: 11 | HfC: 10 | AlN: 8 | ZrB$_2$: 2 | — |
| V-17 | 91 | 4.3 | 0.67 | TiC: 3 | Mo$_2$C: 1 | AlN: 2 | TiB$_2$: 2 | Co: 1 |
| V-18 | 72 | 4.9 | 0.78 | TiC: 15 | AlN: 3 | WC: 5 | Co: 2 | TiB$_2$: 3 |
| V-19 | 79 | 5.5 | 1.1 | TiC: 6 | TiN: 6 | AlN: 4 | TiB$_2$: 3 | Co: 2 |
| V-20 | 80 | 5.8 | 0.82 | TiC: 9 | TaC: 2 | AlN: 4 | TiB$_2$: 4 | Co: 1 |

TABLE 22

| | First layer deposition condition | | | Second layer deposition condition | | | |
|---|---|---|---|---|---|---|---|
| Sample No | Deposition temperature (°C.) | Bias voltage (V) | Nitrogen gas pressure (Pa) | Deposition temperature (°C.) | Bias voltage (V) | Nitrogen gas pressure (Pa) | First layer Composition |
| V-1 | 550 | 125 | 3 | 650 | 150 | 1.5 | Ti$_{0.41}$Al$_{0.50}$W$_{0.02}$Mo$_{0.05}$Si$_{0.02}$N |
| V-2 | 520 | 85 | 3.5 | 500 | 125 | 2 | Ti$_{0.41}$Al$_{0.48}$W$_{0.04}$Si$_{0.03}$Y$_{0.04}$N |
| V-3 | 550 | 175 | 2 | 550 | 100 | 1.2 | Ti$_{0.43}$Al$_{0.49}$W$_{0.06}$Si$_{0.01}$Hf$_{0.01}$N |
| V-4 | 400 | 100 | 2.8 | 600 | 175 | 0.7 | Ti$_{0.39}$Al$_{0.50}$W$_{0.03}$Si$_{0.04}$Nb$_{0.04}$N |
| V-5 | 530 | 75 | 3.8 | 650 | 100 | 1.9 | Ti$_{0.38}$Al$_{0.50}$W$_{0.07}$Ta$_{0.05}$N |
| V-6 | 580 | 30 | 5 | 550 | 200 | 0.2 | Ti$_{0.37}$Al$_{0.53}$W$_{0.02}$Mo$_{0.04}$Si$_{0.04}$N |
| V-7 | 470 | 100 | 4.2 | 550 | 175 | 2 | Ti$_{0.34}$Al$_{0.54}$W$_{0.05}$Si$_{0.04}$Mo$_{0.03}$C$_{0.2}$N$_{0.8}$ |
| V-8 | 550 | 125 | 3.5 | 550 | 150 | 1.5 | Ti$_{0.38}$Al$_{0.52}$W$_{0.03}$Si$_{0.04}$Nb$_{0.03}$N |
| V-9 | 550 | 125 | 3.5 | 550 | 100 | 1 | Ti$_{0.38}$Al$_{0.53}$W$_{0.05}$Si$_{0.02}$Nb$_{0.02}$N |
| V-10 | 550 | 100 | 2.9 | 500 | 125 | 3.5 | Ti$_{0.35}$Al$_{0.49}$W$_{0.08}$Si$_{0.06}$Hf$_{0.02}$N |
| V-11 | 450 | 75 | 3.5 | 500 | 100 | 0.5 | Ti$_{0.27}$Al$_{0.53}$Si$_{0.07}$Nb$_{0.13}$N |
| V-12 | 500 | 120 | 3 | 500 | 150 | 2.5 | Ti$_{0.40}$Al$_{0.48}$W$_{0.04}$Si$_{0.04}$Ta$_{0.04}$N |
| V-13 | 550 | 70 | 3.5 | 550 | 200 | 2 | Ti$_{0.34}$Al$_{0.56}$W$_{0.03}$Mo$_{0.04}$Si$_{0.03}$N |
| V-14 | 500 | 150 | 3.5 | 600 | 125 | 1.5 | Ti$_{0.37}$Al$_{0.50}$W$_{0.05}$Si$_{0.05}$Nb$_{0.03}$N |
| V-15 | 500 | 200 | 3 | 520 | 200 | 3 | Ti$_{0.44}$Al$_{0.43}$W$_{0.05}$Si$_{0.04}$Hf$_{0.04}$N |
| V-16 | 525 | 220 | 3.2 | | — | | Ti$_{0.46}$Al$_{0.45}$W$_{0.03}$Si$_{0.03}$Ta$_{0.03}$N |
| V-17 | 560 | 125 | 6.5 | 450 | 100 | 1.5 | Ti$_{0.37}$Al$_{0.48}$Cr$_{0.06}$W$_{0.05}$Si$_{0.04}$N |
| V-18 | 500 | 50 | 4.5 | 450 | 150 | 2.6 | Ti$_{0.42}$Al$_{0.45}$W$_{0.05}$Si$_{0.05}$Ta$_{0.03}$N |
| V-19 | 350 | 75 | 3.6 | 600 | 125 | 3.5 | Ti$_{0.37}$Al$_{0.48}$W$_{0.05}$Si$_{0.07}$Y$_{0.02}$N |
| V-20 | 520 | 120 | 3.5 | 550 | 120 | 1.1 | Ti$_{0.39}$Al$_{0.47}$W$_{0.01}$Si$_{0.08}$Mo$_{0.05}$N |

| | First layer | | | Second layer | | | |
|---|---|---|---|---|---|---|---|
| Sample No | Average crystal width (μm) | Thickness $t_1$ (μm) | Average particle diameter of dispersed particle (μm) | Composition | Average crystal width (μm) | Thickness $t_2$ (μm) | Total thickness (μm) |
| V-1 | 0.24 | 0.8 | 0.1 | Ti$_{0.33}$Al$_{0.53}$Si$_{0.02}$Hf$_{0.12}$N | 1.3 | 0.5 | 1.3 |
| V-2 | 0.22 | 1.1 | No | Ti$_{0.36}$Al$_{0.55}$Si$_{0.04}$Mo$_{0.05}$N | 2.1 | 0.7 | 1.8 |
| V-3 | 0.15 | 1.0 | 0.21 | Ti$_{0.32}$Al$_{0.54}$Si$_{0.02}$Y$_{0.12}$N | 2.5 | 0.7 | 1.7 |
| V-4 | 0.27 | 0.7 | 0.35 | Ti$_{0.32}$Al$_{0.57}$Si$_{0.03}$Nb$_{0.08}$N | 2.4 | 0.6 | 1.3 |
| V-5 | 0.34 | 1.6 | 0.25 | Ti$_{0.33}$Al$_{0.57}$Si$_{0.05}$Ta$_{0.05}$N | 1.4 | 0.9 | 2.5 |
| V-6 | 0.41 | 1.3 | 0.12 | Ti$_{0.35}$Al$_{0.52}$Si$_{0.03}$Mo$_{0.10}$N | 2.9 | 1.2 | 2.5 |
| V-7 | 0.25 | 1.1 | 0.07 | Ti$_{0.32}$Al$_{0.55}$Si$_{0.03}$Nb$_{0.10}$N | 2.1 | 0.5 | 1.6 |
| V-8 | 0.48 | 0.8 | 0.35 | Ti$_{0.33}$Al$_{0.59}$Si$_{0.05}$Nb$_{0.03}$C$_{0.3}$N$_{0.7}$ | 1.6 | 0.4 | 1.2 |
| V-9 | 0.22 | 1.1 | 0.46 | (Ti$_{0.42}$Al$_{0.58}$)$_{0.5}$(N$_{0.8}$O$_{0.2}$)$_{0.6}$ | 1.2 | 1.1 | 2.2 |
| V-10 | 0.28 | 0.7 | 0.12 | Ti$_{0.25}$Al$_{0.50}$Si$_{0.20}$Mo$_{0.05}$N | 2.5 | 1.6 | 2.3 |
| V-11 | 0.28 | 1.2 | 0.4 | Ti$_{0.39}$Al$_{0.43}$Si$_{0.07}$Ta$_{0.11}$N | 2.4 | 0.6 | 1.8 |
| V-12 | 0.22 | 0.5 | 0.35 | Ti$_{0.33}$Al$_{0.55}$Si$_{0.02}$Mo$_{0.10}$N | 2.1 | 1.1 | 1.6 |
| V-13 | 0.35 | 1.1 | 0.44 | Ti$_{0.33}$Al$_{0.56}$Si$_{0.03}$Nb$_{0.08}$N | 1.5 | 0.5 | 1.6 |
| V-14 | 0.51 | 1.5 | 0.11 | Ti$_{0.32}$Al$_{0.56}$Si$_{0.02}$Hf$_{0.10}$N | 2.5 | 1.5 | 3.0 |
| V-15 | 0.44 | 1.6 | 0.1 | Ti$_{0.39}$Al$_{0.50}$Si$_{0.03}$Nb$_{0.08}$N | 1.1 | 1.4 | 3.0 |
| V-16 | 0.9 | 2.1 | 0.07 | — | | | 2.1 |
| V-17 | 1.4 | 1.9 | 0.4 | Ti$_{0.32}$Al$_{0.56}$Si$_{0.02}$Y$_{0.10}$N | 2.1 | 1.3 | 3.2 |
| V-18 | 0.4 | 1.2 | No | Ti$_{0.42}$Al$_{0.48}$W$_{0.04}$Si$_{0.03}$Mo$_{0.03}$N | 0.2 | 1.2 | 2.4 |
| V-19 | 0.7 | 0.9 | 0.06 | Ti$_{0.33}$Al$_{0.57}$Si$_{0.04}$Nb$_{0.06}$C$_{0.3}$N$_{0.7}$ | 2.5 | 0.7 | 1.6 |
| V-20 | 0.5 | 2.3 | No | Ti$_{0.24}$Al$_{0.51}$Si$_{0.15}$Nb$_{0.10}$N | 2.4 | 2.7 | 5.0 |

TABLE 23

| Sample No | Interfacial roughness (μm) | Ratio of droplet (area %) | Cutting characteristic Chipping | Number of workpieces machined |
|---|---|---|---|---|
| V-1 | 0.12 | 8.5 | No | 90 |
| V-2 | 0.22 | 10.5 | No | 82 |
| V-3 | 0.14 | 22.5 | No | 81 |
| V-4 | 0.21 | 20.1 | No | 62 |
| V-5 | 0.24 | 16.5 | No | 77 |
| V-6 | 0.16 | 0.5 | No | 70 |
| V-7 | 0.24 | 2.1 | Microchipping | 58 |
| V-8 | 0.29 | 5.8 | No | 98 |
| V-9 | 0.1 | 25.1 | Microchipping | 32 |
| V-10 | 0.4 | 20.1 | Early fracture | 7 |
| V-11 | 0.5 | 14.4 | Microchipping | 22 |
| V-12 | 0.28 | 11.2 | No | 46 |
| V-13 | 0.15 | 25.2 | No | 49 |
| V-14 | 0.11 | 9.5 | No | 55 |
| V-15 | 0.2 | 20.1 | Microchipping | 30 |
| V-16 | 0.4 | 14.8 | Chipping (delamination) | 36 |
| V-17 | 0.14 | 30.1 | Chipping (delamination) | 22 |
| V-18 | 0.22 | 15.1 | Microchipping | 34 |

TABLE 23-continued

| Sample No | Interfacial roughness (μm) | Ratio of droplet (area %) | Cutting characteristic Chipping | Number of workpieces machined |
|---|---|---|---|---|
| V-19 | 0.1 | 11.0 | Microchipping | 42 |
| V-20 | 0.06 | 24.6 | Early fracture | 5 |

The results shown in Tables 21 to 23 indicate that in Sample Nos. V-9, 11 and V-15 to 20 including the coating layers, fracture resistance and wear resistance are poor. In contrast, in Sample Nos. V-1 to 8 and V-12 to 14, the coating layers have good fracture resistance and oxidation resistance, and good cutting performance is exhibited.

Example 10

As raw material powders, a total of 80% by volume of cBN raw material powders comprising 20% by volume of a coarse particle cBN raw material powder having an average particle diameter of 5 μm and 60% by volume of a fine particle cBN raw material powder having an average particle diameter of 0.8 μm in, 17% by volume of a TiC raw material powder having an average particle diameter of 1.2 μm, and 3% by volume of a metallic Al raw material powder having an average particle diameter of 1.5 μm were prepared. Then, these powders were mixed with a ball mill using alumina balls for 15 hours. Then, the mixed powder was press-molded into the same shape as in Example 9 under a pressure of 98 MPa. The molded product was heated using a high-pressure/high temperature sintering apparatus at a heating rate of 50° C./min and fired by being maintained at a pressure of 5.0 GPa and 1500° C. for 15 minutes. Then, the product was fired by cooling at 50° C./min to prepare a cBN based sintered body.

Then, coating layers were deposited on the resulting substrate by the same method as in Example 9 under the conditions shown in Table 24 (Sample Nos. V-21 to 30). Cutting using these samples were evaluated by the same method as described above. The results are shown in Table 25.

TABLE 24

| | Deposition condition | | | First layer | | Second layer | | |
|---|---|---|---|---|---|---|---|---|
| Sample No | Deposition temperature (°C.) | Bias voltage (V) | Nitrogen gas pressure (Pa) | Composition | Thickness $T_1$ (nm) | Composition | Thickness $T_2$ (nm) | Total thickness (μm) |
| V-21 | 550 | 125 | 3.5 | $Ti_{0.42}Al_{0.47}W_{0.05}Si_{0.03}Nb_{0.03}N$ | 41 | $Ti_{0.32}Al_{0.55}Si_{0.03}Nb_{0.10}N$ | 50 | 2.3 |
| V-22 | 550 | 150 | 3.0 | $Ti_{0.34}Al_{0.51}W_{0.08}Mo_{0.04}Si_{0.03}N$ | 50 | $Ti_{0.31}Al_{0.57}Si_{0.05}Mo_{0.07}N$ | 39 | 4.1 |
| V-23 | 500 | 125 | 4.2 | $Ti_{0.35}Al_{0.49}W_{0.06}Si_{0.03}Nb_{0.07}N$ | 43 | $Ti_{0.32}Al_{0.53}Si_{0.05}Nb_{0.05}Mo_{0.05}N$ | 40 | 3.6 |
| V-24 | 500 | 100 | 4.5 | $Ti_{0.32}Al_{0.55}W_{0.05}Si_{0.03}Nb_{0.05}N$ | 56 | $Ti_{0.19}Al_{0.60}Si_{0.08}Y_{0.13}N$ | 45 | 2.8 |
| V-25 | 550 | 140 | 3.6 | $Ti_{0.33}Al_{0.52}W_{0.07}Si_{0.04}Ta_{0.04}C_{0.2}N_{0.8}$ | 39 | $Ti_{0.33}Al_{0.52}Si_{0.07}Ta_{0.08}C_{0.3}N_{0.7}$ | 52 | 1.5 |
| V-26 | 500 | 85 | 3.6 | $Ti_{0.41}Al_{0.50}W_{0.04}Si_{0.02}Mo_{0.03}N$ | 55 | — | | 2.2 |
| V-27 | 500 | 105 | 3.4 | $Ti_{0.40}Al_{0.45}Si_{0.05}W_{0.1}N$ | 61 | $Ti_{0.32}Al_{0.55}Si_{0.06}Nb_{0.07}N$ | 50 | 3.5 |
| V-28 | 500 | 125 | 4 | $Ti_{0.40}Al_{0.46}Si_{0.06}Nb_{0.08}N$ | 40 | $Ti_{0.24}Al_{0.54}Si_{0.06}Nb_{0.16}N$ | 31 | 2.9 |
| V-29 | 550 | 100 | 4.5 | $Ti_{0.44}Al_{0.52}W_{0.02}Si_{0.01}Mo_{0.01}N$ | 55 | $Ti_{0.38}Al_{0.50}W_{0.03}Si_{0.05}Mo_{0.04}N$ | 40 | 3.1 |
| V-30 | 500 | 70 | 5 | $Ti_{0.33}Al_{0.50}Si_{0.02}Nb_{0.15}N$ | 61 | $(Ti_{0.45}Al_{0.55})_{0.5}(N_{0.8}O_{0.2})_{0.6}$ | 53 | 4.1 |

TABLE 25

| Sample No | Ratio of droplet (area %) | Cutting characteristic Chipping | Number of workpieces machined |
|---|---|---|---|
| V-21 | 15.2 | No | 102 |
| V-22 | 21.4 | No | 81 |
| V-23 | 10.3 | No | 88 |
| V-24 | 19.2 | Microchipping | 61 |
| V-25 | 14.6 | No | 71 |
| V-26 | 15.1 | Microchipping | 35 |
| V-27 | 8.4 | Microchipping | 31 |
| V-28 | 20.5 | Chipping (delamination) | 21 |
| V-29 | 30.6 | Early fracture | 6 |
| V-30 | 28.5 | Microchipping | 40 |

The results shown in Tables 24 and 25 indicate that in Sample Nos. V-26 to 30 including the coating layers, fracture resistance and wear resistance are poor. In contrast, in Sample Nos. V-21 to 25, the coating layers have good fracture resistance and oxidation resistance, and good cutting performance is exhibited.

The invention claimed is:

1. A cutting tool comprising:
   a substrate; and
   a coating layer on the substrate comprising:
   a first layer comprising $Ti_{1-a-b-c-d}Al_aW_bSi_cM_d(C_{1-x}N_x)$ (wherein M is at least one selected from Nb, Mo, Ta, Hf, and Y, $0.45 \leq a \leq 0.55$, $0.01 \leq b \leq 0.1$, $0 \leq c \leq 0.05$, $0.01 \leq d \leq 0.1$, and $0 \leq x \leq 1$); and
   a second layer comprising $Ti_{1-e-f-g}Al_eSi_fM'_g(C_{1-y}N_y)$ (wherein M' is at least one selected from Nb, Mo, Ta, Hf, and Y, $0.50 \leq e \leq 0.60$, $0 \leq f \leq 0.1$, $0.05 \leq g \leq 0.15$, and $0 \leq y \leq 1$).

2. The cutting tool according to claim 1,
   wherein a thickness of the first layer is 1 to 7 μm, and a thickness of the second layer is 0.5 to 5 μm.

3. The cutting tool according to claim 1,
   wherein an average crystal width of the first layer is 0.01 to 0.5 μm and an average crystal width of the second layer is 0.6 to 3 μm.

4. The cutting tool according to claim 1,
   wherein dispersed grains having an average crystal grain diameter of 0.05 to 1 μm are scattered in the first layer.

5. The cutting tool according to claim 1,
   wherein the coating layer comprises two or more of the first layer and the second layer which are alternately laminated.

6. The cutting tool according to claim 5,
   wherein a thickness of each of the first layers is 0.02 to 0.7 μm, a thickness of each of the second layers is 0.01 to 0.5 μm, a total thickness of the first layers is 1 to 7 μm, and a total thickness of the second layers is 0.5 to 5 μm.

7. The cutting tool according to claim 1,
   wherein the substrate comprises a cemented carbide comprising 60% to 95% by mass of WC, 0% to 10% by mass of a carbide, a nitride, or a carbonitride of at least one of the group 4, 5, and 6 metals in the periodic table, and 5% to 30% by mass of an iron group metal.

8. The cutting tool according to claim 1,
   wherein the substrate comprises an $Al_2O_3$ sintered body comprising $Al_2O_3$, 0% to 1% by mass of MgO, a total of 10% to 70% by mass of at least one selected from the group consisting of a carbide, a nitride, and a carbonitride of Ti or Si, and a total of 0.1% to 2.0% by mass of at least one of Co and Ni.

9. The cutting tool according to claim 1,
   wherein the substrate comprises a $Si_3N_4$ sintered body comprising 94.5% to 99.5% by mass of silicon nitride, 0.1% to 4.5% by mass of a rare earth (RE) element oxide in terms of $RE_2O_3$, 0.3% to 2.5% by mass of magnesium oxide in terms of MgO, 0% to 0.6% by mass of aluminum oxide in terms of $Al_2O_3$, 0.1% to 4.5% by mass of residual oxygen in terms of silica ($SiO_2$), and 0% to 2% by mass of a silicide of a group 6 element in the periodic table.

10. The cutting tool according to claim 1,
    wherein the substrate comprises a cBN sintered body comprising 70% by volume or more of cBN particles having two peaks corresponding to cBN coarse particles having a particle diameter of 4 to 6 μm and cBN fine particles having 0.5 to 1.2 μm in a particle size distribution of the cBN particles, and these cBN particles are bonded together with binder phases comprising a carbide of at least one element selected from the group 4, 5, and 6 metals in the periodic table and an iron group metal.

11. The cutting tool according to claim 1,
    wherein the second layer is on the first layer.

12. A cutting tool comprising:
    a substrate; and
    a coating layer on the substrate consisting essentially of:
    a first layer consisting essentially of $Ti_{1-a-b-c-d}Al_aW_bSi_cM_d(C_{1-x}N_x)$, (wherein M is at least one selected from Nb, Mo, Ta, Hf, and Y, $0.45 \leq a \leq 0.55$, $0.01 \leq b \leq 0.1$, $0 \leq c \leq 0.05$, $0.01 \leq d \leq 0.1$, and $0 \leq x \leq 1$); and
    a second layer consisting essentially of $Ti_{1-e-f-g}Al_eSi_fM'_g(C_{1-y}N_y)$ (wherein M' is at least one selected from Nb, Mo, Ta, Hf, and Y, $0.50 \leq e \leq 0.60$, $0 \leq f \leq 0.1$, $0.05 \leq g \leq 0.15$, and $0 \leq y \leq 1$).

* * * * *